United States Patent [19]

Rossler

[11] 4,087,795
[45] May 2, 1978

[54] MEMORY FIELD EFFECT STORAGE DEVICE

[75] Inventor: Bernward Rossler, Munich, Germany

[73] Assignee: Siemens Aktiengesellschaft, Munich, Germany

[21] Appl. No.: 750,860

[22] Filed: Dec. 15, 1976

Related U.S. Application Data

[63] Continuation of Ser. No. 614,682, Sep. 18, 1975.

[30] Foreign Application Priority Data

| Sep. 20, 1974 | Germany | 2445078 |
| Sep. 20, 1974 | Germany | 2445079 |
| Sep. 20, 1974 | Germany | 2445091 |
| Sep. 20, 1974 | Germany | 2445137 |
| Feb. 12, 1975 | Germany | 2505816 |
| Feb. 12, 1975 | Germany | 2505821 |

[51] Int. Cl.² ............... G11C 11/40; H01L 29/78; H03K 5/00
[52] U.S. Cl. ........................... 365/185; 357/23; 307/238
[58] Field of Search ..... 340/173 R, 173 FF, 173 AM; 307/238, 304; 357/23, 41, 54

[56] References Cited

U.S. PATENT DOCUMENTS

| 3,660,819 | 5/1972 | Frohman-Bentchkowsky .... 307/304 |
| 3,662,187 | 5/1972 | Ayres et al. ........................... 307/304 |
| 3,728,695 | 4/1973 | Frohman-Bentchkowsky .... 340/173 R |
| 3,825,945 | 7/1974 | Masuoka ................................ 357/23 |
| 3,893,085 | 7/1975 | Hansen ............................ 340/173 R |
| 3,936,811 | 2/1976 | Horninger ............................ 307/238 |
| 3,952,325 | 4/1976 | Beale et al. ............................ 357/23 |

*Primary Examiner*—Daryl W. Cook
*Attorney, Agent, or Firm*—Schuyler, Birch, Swindler, McKie & Beckett

[57] ABSTRACT

A n-channel storge field effect election device having a floating gate completely surrounded by insulating material is described. During writing in the storage the floating gate is charged negatively by hot elections generated in its own channel by channel injection. After charging, and particularly during reading, the gate inhibits drain to source current, by means of its negative charge.

78 Claims, 30 Drawing Figures

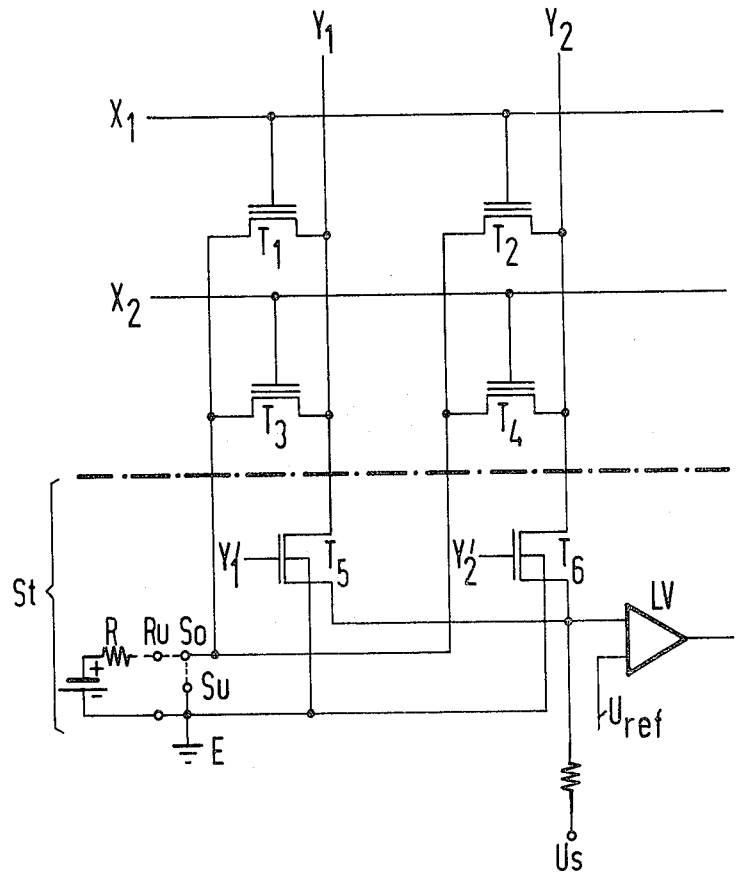

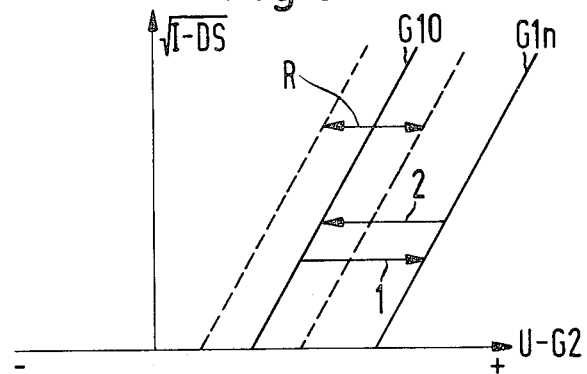
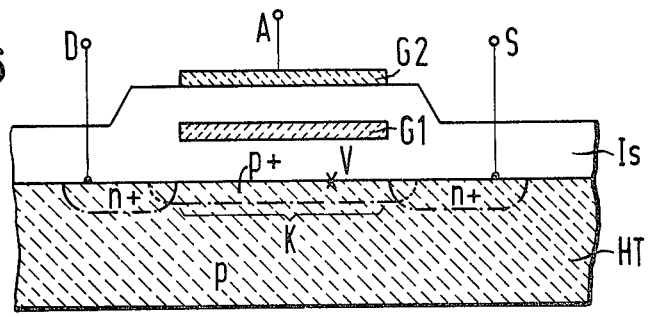
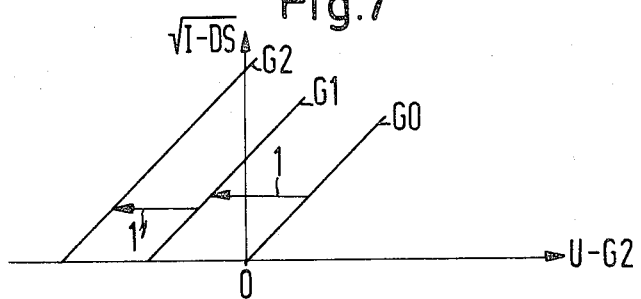

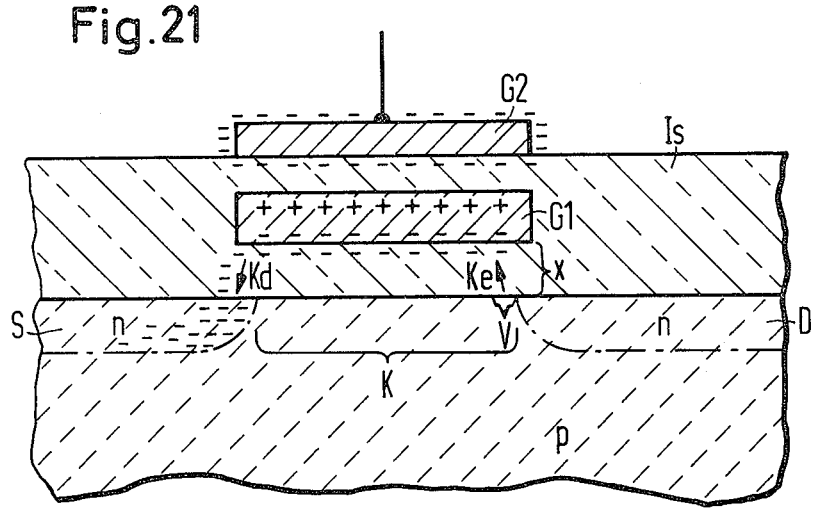
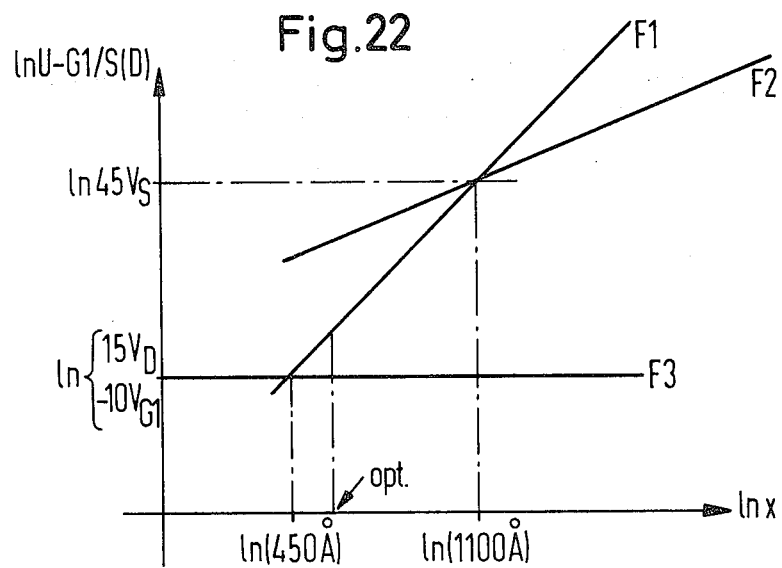

MEMORY FIELD EFFECT STORAGE DEVICE

This is a continuation of application Ser. No. 614,682 filed Sept. 18, 1975.

BACKGROUND OF THE INVENTION

1. Field of the Invention

The invention relates to an electronic device having storage retention capabilities and designed for use in, for example, a program memory of a data processing system.

2. State of the Prior Art

Memory field effect transistors (FETs) with storage retention capabilities and provided with a floating gate completely surrounded by an insulator have been disclosed in a great number of publications. A summary is given below of the properties of such memory FETs known in the prior art.

Memory FETs are programmable by means of the avalanche effect (cf. Solid-State Electronics 17 (1974), pp. 517–529) that is, in such memory FETs the floating gate is charged with carriers that are heated, or have relatively greater energy levels, as a result of the avalanche breakdown at the interface between drain and substrate, upon the breakdown of this otherwise non-conducting p-n junction. Due to their increased energy, these carriers can pass through the insulator, particularly if a voltage accelerating them is applied between the substrate and the floating gate. For example, FIG. 1 of U.S. Pat. No. 3,660,819, shows that such memory FETs with a floating gate 14 may also have a controllable charging gate 18 that acts capacitively on the floating gate 14. This influences the potential of the floating gate 14 and, hence, the drain to source current. Such memory FETs with a floating gate and controllable charging gate have been disclosed in a great number of other publications.

The carriers that are heated as a result of avalanche breakdown and injected into the floating gate may be electrons or holes. As is generally known, in n-channel memory FETs these carriers are holes, and in p-channel memory FETs they are electons (see the prior art cited hereinabove). Thus, the charge carriers charging the gate and heated by means of the avalanche effect have the polarity of the monority carriers in the drain.

Hence, in conventional memory FETs, the floating gate is charged negatively if it is a p-channel memory FET, but positively if it is a n-channel memory FET. Thus, the floating gates of both types of memory FETs charged as a result of avalanche breakdown always switch the relevent FET to its conducting state. This is due to the fact that the floating gate, regardless of the type of channel, will always exert such an infuence on the substrate region between drain and source by means of the injected charges, through electrostatic induction, that, compared with uncharged floating gates, the drain to source current is not inhibited, but stimulated. Thus, the injected charges exert such an influence on said substrate region that, through electrostatic induction, free charges are accumulated therein having the same polarity as the majority carriers in drain and source.

Accordingly, enhancement-mode FETs have been employed in the prior art as memory FETs, because only in such a FET is the resistance between source and drain in the non-program mode, that is, with the floating gate in uncharged condition, very high and in the program mode very low by comparison. Thus, the ratio of these two resistances is very high.

This phenomenon is illustrated in FIG. 7 herein, which is a graph of the dependence of the drain to source current I-DS on the charging gate/source voltage U-G2 of a conventional n-channel memory FET (cf. FIGS. 2 and 4 of IEEE Journal of Solid State Circuits SC7, No. 5, October 1972, pp. 369–375). The curve G0 in FIG. 7 applies to an uncharged floating gate of an enhancement-type FET and the curve G1 applies to a floating gate of the same FET charged by avalanche breakdown. By charging the floating gate (see 1 in FIG. 7), the conventional memory FET conducts current even if U-G2=0. Thus, after programming, the enhancement-type FET has the characteristics of a depletion-type FET with respect to its charging gate G2. Only after quenching, i.e., after discharging the floating gate, does the resistance of the memory FET for U-G2=0 increase again, since in that case the curve G0 can again be applied more or less accurately to the FET. Thus, the FET resumes its enhancement-type characteristics with respect to its charging gate G2.

If, instead, the conventional memory FET were equipped with a depletion-type channel, the floating gate charged during an avalanche breakdown condition would make the resistance of the existing channel still lower than it already is when the floating gate is the non-programmable mode. This, too, is illustrated in FIG. 7. The curve G1 shows the dependence of the drain to source current I-DS on the charging gate-source voltage U-G2 in the case of a N-channel depletion-type memory FET in which the floating gate is in the non-program mode. When the floating gate of said FET is charged by avalanche breakdown, the curve G2 expresses the dependence of the drain to source current I-DS on the floating gate-source voltage U-G2. Due to the charging of the floating gate of the FET (see 1' in FIG. 2), that is, with the floating gate in the program mode, the FET conducts current if U-G2=0. Thus, in this mode, as in the unprogrammed mode, the depletion-type FET has depletion-type properties with respect to its charging gate G2. The conductivity of the memory FET is only insignificantly increased as a result of the programming, viz. by the factor 2, as soon as the depletion-type FET is programmaed by avalanche breakdown. This is illustrated in FIG. 7 by the intersection of the curve G2 with the I-DS axis.

Therefore, the ratio of the resistance between drain and source in the non-program mode to the resistance between drain and source in the program mode is much worse than in the case of the enhancement-type memory FET. Hence, only enhancement-type memory FETs have been employed in the prior art.

As is generally known, memory FETs with a floating gate can be quenched by optical means (see the prior art cited hereinabove, e.g., by illumination with ultraviolet light). Due to the irradiation, holes or electrons can be heated such that they pass through the insulator, discharging the floating gate.

Another method for quenching such memory FETs having a floating gate by electrical means is known. To do this, the charged floating gate of a first memory FET is later discharged with charges having an opposite polarity by means of a second avalanche breakdown produced in a second memory FET connected in parallel to the first memory FET (FIGS. 1 and 4 with accompanying description in the IEEE publication cited above). To achieve this, the memory FET simulates a parallel connection of a p-channel memory FET and a n-channel FET with a single common floating gate, and this device is referred to as the two-junction type (FIG. 6 herein). Similarly, said two-junction type, as shown in FIG. 1, has two different p-n junctions which optionally can be charged for breakdown in order to generate heated electrons or holes. In the non-program mode (see FIG. 4 of the referenced IEEE publication "as grown"), the two-junction type corresponds to an enhancement-type memory FET and, thus, is nonconducting if no voltage is applied to its floating gate. By means of the first avalanche breakdown the two-junction type is switched to the program mode, i.e., to its conducting state (see "1" state in FIG. 4 of the IEEE publication) by electrons injected onto the floating gate. By means of the second avalanche breakdown the two-junction type is discharged again by the holes (see "0" in said FIG. 4 of the IEEE publication).

Thus, in the non-program mode, all these conventional FETs are enchancement-type FETs with respect to their floating gates. However, in the program mode they always behave like depletion-type FETs, as far as their floating gates are concerned. Since the discharging usually does not occur without certain faults, there remain certain residual charges on the floating gate or in traps of the insulator between floating gate and substrate so that, after discharge, the two-junction type does not exhibit exactly the characteristics that existed prior to programming (see the spreads of the points of measurement in FIGS. 4 and 5 of the IEE publication). Nevertheless, after discharge the two-junction type behaves, as before, like an enhancement-type FET which, after reprogramming, is again conducting like a depletion-type FET.

These faults occurring during the electric quenching of memory FETs also occur in a conventional electrically quenchable FET having a channel length of about 10 micrometers and a resistivity of the p-substrate of about 10 ohm-cm and a normal structure of the drain and source (see FIGS. 2 and 5 of the above mentioned IEE publication). In this case, an n-channel memory FET is involved with an insulated floating gate G1 and an externally controlled floating gate G2. As is normal in prior art structures, the memory FET is of the enhacement type and in the non-program mode. Accordingly, after fabrication but prior to programming (see the "as grown" curve in FIG. 5 of the IEEE publication), the FET nonconducting when the floating gate G2 is free of potential. The memory FET is programmed by avalanche injection of holes and, thus, as is customary in presently known techniques, switched to its conducting state (see "1" in FIG. 5 of the IEEE publication). Thus, as a result of the programming, the enhancement-type memory FET assumes the characteristics of a depletion-type FET with respect to its floating gate. In this regard the memory FET is not different from other prior art n-channel memory FETs with a floating gate.

However, the quenching is not effected by electrical means nor with the aid of a second avalanche breakdown, as is the case with the two-junction type shown in the FIG. 1 cited above. The quenching of the positively charged floating gate shown in FIG. 5 occurs by electrical means with the aid of a very rare physical effect, only described by these authors, and referred to as "channel injection". As described in the above referenced IEEE publication, the memory FET is switched at its floating gate to a virtually nonconducting state, so that in a small region of the channel a substantially smaller charge carrier density prevails than in the other regions of the channel. In the low-charge region there arise fairly high longitudinal field strengths between source and drain relative to the remaining higher-charge regions of the channel. The free flowing in the low-charge region are thus heated up to a greater degree than in the remaining channel regions. If the charges are sufficiently hot in the low-charge region, they can pass through the insulation and charge the floating gate G1. The channel-injection induced charges passing through the insulation are in this case electrons which are used to inversely charge the floating gate of the n-channel memory FET. Thus, for quenching purpose, the floating gate is provided with electrons generated by channel injection, and for programming purposes with holes generated by avalanche breakdown.

After the discharge produced by the channel injection, which according to said publication, occurs very slowly, the memory FET has approximately the same enhancement-type characteristics as prior to programming. Thus, if the floating gate is free of potential, the source and drain region is more or less nonconducting. Here, too, small faults are normally noticeable after discharge, because residual charges remain on the floating gate or in traps of the insulator between the floating gate and the substrate. As a result of the residual charges, the memory FET, after quenching, has not exactly the same characteristics as prior to programming.

The various prior art memory FETs with an insulated floating gate are thus so programmed, using the avalanche breakdown, that they are switched to the conducting state, that is, that the charging of the floating gate acts on the source and drain region through induction in such a manner that it stimulates the drain to source current. As a result of the programming, the memory FET assumes depletion-type characteristics. Optical and two different electrical quenching methods have been disclosed, whereby the electrical quenching is effected either by means of a second memory FET or by using the channel injection.

OBJECTS OF THE INVENTION

It is an object of the present invention to provide a storage electron device in which it is possible to charge the floating gate, during programming, with charges that are generated in the device itself, such that the charging acts in a current inhibiting manner, rather than in a stimulating manner on the source and drain region.

It is another object of the invention to provide such a device in contrast to prior art devices in which the charged floating gate, i.e., in the program mode, exerts an inhibiting influence on the source and drain region.

A further object is to provide a device of this type in which it is unnecessary to connect in parallel two such devices having different channels and a common floating gate. Hence, all the carriers that charge and discharge the floating gate shall be generated by heating them in a single such device itself.

Still another object is to provide a completely novel type of memory FET with an insulated floating gate and a structure that is less critical with respect to manufacturing tolerances and less complex vis-a-vis the two junction type.

An additional object of the invention is to provide a memory FET which affords the possibility of performing the electrical quenching by using free charges generated in the memory FET itself.

A further object is to provide a memory FET structure in which the channels are always fully nonconducting both in the program and in the non-program mode, resulting in highly unusual characteristics that offer special advantages.

SUMMARY OF THE INVENTION

The invention is based on the principle that in order to program a floating gate, carriers that have a polarity corresponding to that of the minority carriers of the drain will no longer be used, but carriers that have a polarity corresponding to that of the majority carriers of the drain will be used to program the gate. The invention is also based on the recent discovery that using channel injection one can heat up electrons, but substantially no holes are affected so that they charge the floating gate. In addition, the invention offers the possibility of applying surprising effects heretofore not utilized. Surprisingly, structures of the memory FET constructed according to the invention can even be programmed very rapidly (e.g., within a millisecond) by means of electrons generated by channel injection. Because of the mere fact that the subject matter of the invention has a n-channel, the time required for programming is substantially less than if a p-channel had been chosen, probably because, due to the high density of electrons in the n-channel, the number of electrons that are adequately heated up for channel injection is greater than in p-channel memory FETs.

The invention proceeds from a n-channel memory FET having a floating gate completely surrounded by an insulator. The memory FET according to the invention is characterized by the fact that its floating gate, during programming, is charged negatively by electrons heated in its own channel and that its floating gate after the charging, above all during reading, exerts an inhibiting influence on the source and drain region, by means of its negative charge through electrostatic induction into the drain to source current.

Preferably, the memory FET constructed according to the invention has the shortest possible channel length (e.g., 3 micrometers, or, possibly shorter) and a substrate with a comparatively high resistance (e.g., 3 to 10 ohm-cm) so as to provide an acceleration space. Alternatively the channel can be provided with an acceleration space produced by a 3-dimensional inhomogeneity permitting the electrons that shall charge the floating gate by channel injection to be heated to a great degree.

Thus, according to the invention, the channel injection, to which hardly any attention has been paid in the past, is utilized, not for quenching, but for programming the n-channel memory FET. The electrons charging the floating gate switch the source and drain region to the conducting state, because these charges injected onto the gate accumulate holes between drain and source, as a result of electrostatic induction, thereby increasing the resistance between drain and source. If the memory FET according to the invention has in the program mode an enchancement-type channel, which is normally nonconducting, the memory FET will be more nonconducting in the program mode than it already is in the non-program mode.

If the memory FET according to the invention has a depleation-type channel, which is not customary in conventional memory FETs, the channel of the memory FET will be nonconducting in the program mode, or will at least be highly resistive due to the electrons heated in its own channel by channel injection.

Should the memory FET according to the invention be quenched again, its nonconducting pn-drain-substrate junction can be charged for breakdown, so that charges heated in the same memory FET discharge the floating gate.

BRIEF DESCRIPTION OF THE DRAWINGS

The principles of the invention will be more readily understood by reference to the descriptions of preferred embodiments constructed accordingly and given below which are briefly described as follows.

FIG. 4 is a schematic diagram of a two dimensional storage matrix having as memory cells memory FETs constructed according to the invention.

FIG. 5 is a current-voltage characteristic diagram of an embodiment of a memory FET according to the invention having a special heretofore unknown channel design, viz. a "barrier-type channel", instead of a depletion-type or enhancement-type channel, and FIG. 6 is an embodiment of a memory FET according to the invention having a barrier-type channel in the non-program mode.

FIG. 7 is a current-voltage characteristic of a prior art device as described above.

FIG. 21 is a partial schematic view illustrating charge relationhips for quenching.

FIG. 22 is a graph illustrating insulator dimensioning parameters.

DETAILED DESCRIPTION OF PREFERRED EMBODIMENTS

Figure 1:
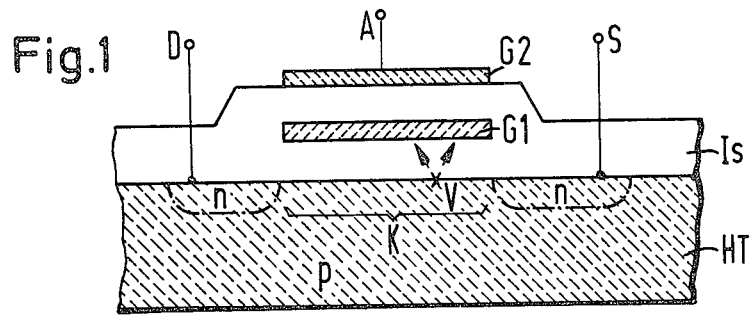
FIG. 1 is a cross-section view of an embodiment of a memory FET constructed according to the invention.

The n-channel memory FET illustrated in FIG. 1 comprises an electrically floating gate G1 completely surrounded by an insulation material Is. A substrate HT embodied in the integrated circuit is p-doped and contains two n-doped regions forming the drain D and the source S. A channel K is formed in the substrate HT between the drain and the source, when the FET is switched to its conducting state. A particular feature of this memory device is the fact that it also has a charging gate G2 controlled externally by terminals A.

The illustrated FET is a channel-injection type. Thus, the channel K has in its poorly conductive or even in its highly conductive state to be described further below, (e.g., at location V shown in FIG. 1) a region in which the local longitudinal field strength between drain and source is substantially greater than in the other regions of channel K. Due to the localized high field strength, an acceleration space V is created in channel K in which the free electrons flowing in the channel are heated to such a great degree (e.g., reaching an energy up to 3.6V) that a part thereof can leave channel K at point V, or in the immediate vicinity thereof, pass through the insulation Is, and charge the floating gate G1 negatively. The acceleration space V may, for example, be produced in a manner in itself known and described above by activating the memory FET at the terminal A of its charging gate G2 with a positive voltage.

Other possibilities exist for producing acceleration space V in channel K and, hence, for producing the channel injection. The acceleration space may, for example, be produced by a substantially 3-dimensional inhomogeneity of the channel width, viz. by a greatly localized (e.g., wedge-shaped) reduction in the channel width at site V and/or also by a localized large thickening of the insulation Is at that location. The longitudinal field strength is increased at that location due to the inhomogenity of the channel, even in the highly conducting mode of the channel, as a result of which (in the case of a conductive channel), a great many hot electrons can pass through from the location to the floating gate G1. The floating gate will be charged the more rapidly with hot electrons the stronger the inhomogenity and the greater the drain to source current. This will be detailed further below.

The embodiment depicted in FIG. 1 is an n-channel memory FET with a floating gate G1 completely surrounded by an insulation Is. During programming, the floating gate G1 is charged negatively by channel-injection induced hot electrons, i.e., generated in an acceleration space V of channel K. It is advisable to charge the charging gate G2, during programming, so positively that a potential accelerating the electrons is applied between the acceleration space V and the floating gate G1. After programming, particularly during the reading of the state of the memory FET (see 1 or 4 in FIG. 2, as well as 1 in FIG. 2), the floating gate G1 exerts, by means of its negative charge, through electrostatic induction into the source and drain region K, an inhibiting rather than stimulating influence on the drain to source current. The inhibition will cause the current to be interrupted if the memory FET has a depletion-type channel (see the curves G1p, G10 of FIG. 2 or the curves G10, G1n of FIG. 3).

Figure 2:
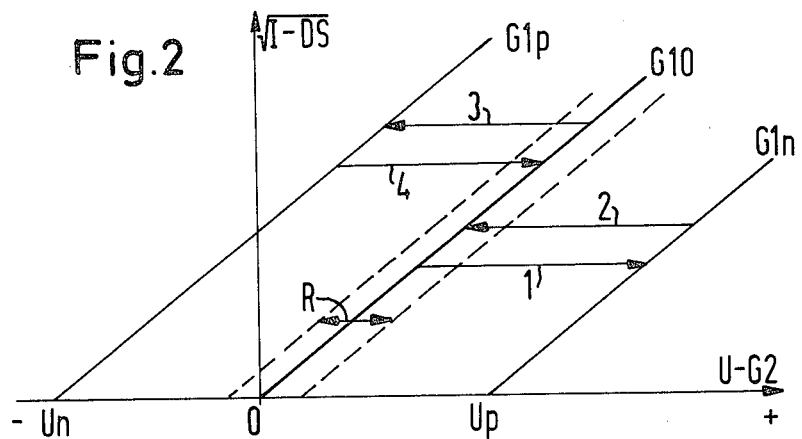
FIG. 2 is a current-voltage characteristic diagram of an embodiment of the FIG. 1 type which in the non-program mode is partly of the depletion and partly of the enhancement-type.

Curve G1p of FIG. 2 corresponds to the memory FET of the invention having a depletion-type channel in the non-program mode. As a result of the programming (see 4 in FIG. 2, and 1 in FIG. 3), floating gate G1 is charged negatively, so that the memory FET assumes, for example, the characteristics of an enhancement-mode FET, as shown on curve C10 of FIG. 2, or even the characteristics of a heretofore unknown FET with a "barrier-type channel", as shown on curve G1n of FIG. 3. With the barrier-type characteristics, channel K is driven into its fully nonconducting state due to the programming of the floating gate, so that the memory FET is driven into its nonconducting state merely by a gate voltage of the charging gate which is greater than the threshold value Up.

If the memory FET according to the invention, in the non-programmed mode, is of the enhancement-type, i.e., if it has an enhancement-type channel (see FIG. 2, curve G10), the memory FET will likewise assume nonconducting-type characteristics as a result of the programming 1 shown on curve G1n of FIG. 2.

Thus, a memory FET constructed according to the invention, which in the program mode has nonconducting-type characteristics, is characterized by the fact that in the program mode the channel even will not conduct if the floating gate G1 (e.g., due to an imperfect insulation) discharges slightly with time, even if gate voltages U-G2 below a relatively high voltage threshold (Up) are applied to the externally-controlled floating gate G2. The performance of the memory FET constructed according to the invention in the barrier-type mode is unusual.

Since each memory FET structured according to the invention can be driven far into its nonconducting region during programming, independently of the design of the channel, so that after the programming it has barrier-type characteristics, all embodiments of the FET of the invention can be operated such that gradual discharges of the floating gate G1 caused by imperfections in the insulation, as well as residual charges adhering to the insulator Is, generally have no deleterious effects on the amplitude of the signals occurring during the reading of the memory FET. Thus, the memory FET designed according to the invention is particularly not prone to interferences if, during programming, it is driven far into its nonconducting region; this is made possible by utilizing the teachings in accordance with the invention.

A multiplicity of memory FETs according to the invention can be arranged to form the matrix illustrated in FIG. 4, which has only one memory FET for each memory cell. Obviously, the number of memory cells is optional. In this case, during reading, all programmed and all unprogrammed memory FETs can be switched to the nonconducting state by appropriate working voltages, with the exception of the unprogrammed memory FET selected for reading, applied to the floating gate of which a read potential not exceeding the threshold value Up (see FIGS. 2 and 3) is applied over the proper horizontal control leads X and which switches the channel thereof to the conducting state. The memory FET shall conduct in the non-program mode and not conduct in the program mode.

If the memory FET, in the non-program mode, is of the enhancement type, by having an enhancement-type channel then a low positive read potential across the horizontal control lead X suffices for this purpose. In the case of memory FETs with a depletion-type channel (see FIG. 3), ground potential suffices as the read potential, so that a matrix having such memory FETs can very easily be operated. As a result of the reading, a signal corresponding to the storage state of the memory FET is sent to the output amplifier LV over E, over SO, over the source and drain region of the selected memory FET, and over the column switch (i.e., T5 or T6).

This matrix, thus, has a very simple structure and a very simple mode of operation. Also, the memory FETs in the matrix can easily be programmed by applying a positive potential of sufficient magnitude to the charging gate of the selected memory FET to generate the acceleration voltage between floating gate and acceleration space V and a channel voltage over the associated vertical control lead Y (e.g., over one of the row switches T5 or T6), and by causing a current to flow through the source and drain region of said selected memory FET from the terminal So (i.e., Ru or Su) to the proper vertical control lead Y and further to the voltage source Us of the programming channel.

Owing to the flowing current, electrons are heated in the channel of the selected memory FET which, by channel injection, charge the associated floating gate negatively. Also the structure of the memory FETs, which will be detailed below and which in the non-program mode have a barrier-type channel, are suitable for arrangement into such a matrix, whereby they can be operated in a substantially uniform manner. However, the read potential on the horizontal control lead X must be correspondingly higher, so that small positive parasitic voltages on the horizontal control leads X are rendered harmless. Particular advantages of the barrier-type memory FET will be detailed below. Further details of the design of the matrix will also be described below.

If the memory FET according to the invention is conducting in the non-program mode, be it well-conducting or poorly conducting, that is, if the memory FET of the invention has a depletion-type channel in the non-program mode, then it is sufficient for the memory FET to have only the floating gate G1. The charging gate is not necessary to ensure that the nonconducting or conducting mode of the memory FET can unambiguously be assigned to either programming mode. Even if after a quenching (cf. 2 in FIG. 3 for 4U-G2=0 and 3 in FIG. 2 for U-G2=0), residual charges are present (e.g., on the floating gate or in the insulator) that have a deleterious effect on the channel (see the troublesome shift R in FIG. 2), the allocation remains clearly possible, because in this case, too (see the curve G1n in FIG. 3 for the value U-G2=0) the floating gate during programming can be driven far into the completely nonconducting region of the memory FET. Thus, the floating gate has barrier-type characteristics in the program mode. Matrices containing such memory FETs are preferably provided with memory cells which, in addition to the storage, also contain an additional controllable FET in the manner of the cells shown in Solid-State Electronics 17 (1974) page 528, FIG. 21.

From Solid-State Electronics 17 (1974), pp. 517-529, particularly FIGS. 3(b) and 5 and accompanying description, it is clear that the overlap between the drain and the floating gate and between the source and the floating gate affects the charging of the floating gate with hot carriers. Provision is, likewise, made in an embodiment of the invention that the capacitance between drain and floating gate, by use of a correspondingly large overlap of these two parts of the memory FET, is much larger than the capacitance between source and floating gate. In this way, the floating gate is more heavily affected by the potential of the drain than by the potential of the source. Since the source is normally negative with respect to the drain, the floating gate in this structure is capacitively supplied with positive potential during the operation of the drain. Thus, the channel injection is supported by the overlap region in that a positive voltage attracting the hot electrons is generated on the floating gate G1.

Similar effects, as the overlap between drain and floating gate, are found in another embodiment of the invention, wherein a charging gate is disposed which is directly electrically connected to the drain. This charging gate has a similar effect as the overlap between drain and floating gate described earlier, but to a far greater extent, because the overlap surface between drain and floating gate is much larger here than in the structure described previously, viz. approximately as large as the surface of the floating gate that is covered by the charging gate. In this embodiment, due to the particularly great capacitive coupling between drain and floating gate, the supply of the floating gate with a positive potential during reading, and particularly during programming, is very great. In this embodiment, the acceleration voltage between the acceleration space V (see FIG. 1) and floating gate G1 is particularly large, so that the charging of the floating gate G1 with hot electrons is correspondingly large.

In a further embodiment of the invention, the floating gate G2 is not connected to the drain. During programming, the charging gate is supplied with a more positive potential than the drain so that, due to the strong capacitive coupling between charging gate and floating gate, the floating gate is in this case supplied with a very large acceleration voltage for the heated electrons.

In one embodiment of the invention, there is provided an as short a channel K as possible having a length of, e.g., 1 to 3 micrometers. Preferably, the length shall not exceed 10 micrometers. This arrangement is used because the shorter the channel, the smaller is the necessary total voltage between drain and source during programming. If the total voltage exceeds a critical value, i.e., if the channel length exceeds a corresponding critical value, the p-n junction between drain and substrate is undesirably and easily driven into its conducting state through induction of the electrons stored on the floating gate G1. If this should happen, parasitic, interfering holes generated by avalanche breakdown in the p-n junction can make their way to the floating gate G1, thereby discharging it. This unwanted discharge of the floating gate occurs particularly in an excessively long channel, because in an excessively long channel the programmed floating gate G1 is often charged to a more negative potential than the drain, resulting in the channel K being interrupted in the p-n junction between drain and substrate. However, a sufficiently high negative charge on the floating gate is difficult to achieve in a very long channel, particularly because of the discharge, by means of holes generated by avalanche breakdown, when it is not desired that the gate voltages across the charging gate G2 are unusually high during programming. Hence, the embodiment of the invention with a short channel has, above all, the advantage that it can easily be operated with relatively low working voltages between drain and source and with relatively low gate voltages across the charging gate G2.

Moreover, it has been found that the substrate HT (FIG. 1) of the memory FET must, if possible, not be of very low resistance, but preferably should have a specific resistance considerably above 1 ohm-cm, e.g., 3 to 10 ohm-cm. The higher the specific resistance, the smaller the parasitic capacitances, particularly between drain and substrate and source and substrate. It has been found that a high specific resistance of the substrate HT only has little inhibiting effect on the channel injection, if at all.

FIG. 6 shows an embodiment of the memory FET of the invention, which in the non-program mode has barrier-type characteristics. On the surface of the substrate HT in the region of the channel K between drain and source and p-doped in the usual manner there is disposed a $p^+$-doped layer. This layer may be formed by ion implantation prior to fabrication of the drain and source. In this layer, the channel K is produced in the conducting state of the FET. The channel K has barrier-type characteristics as a result of the $p^+$-doping of said layer in the channel region of the FET. A relatively high positive potential, i.e., a potential exceeding a positive threshold value, is coupled to the charging gate G2 even in the non-program mode of the floating gate G1. This potential fully compensates for the effect of the holes accumulated as a result of the $p^+$-doping in the channel K. Not until this compensation has taken place can free negative charges, through induction, be accumulated in the $p^+$-doped channel region. Above the threshold value, the n-channel K thus becomes conductive between the n-doped drain and source. Thus, the memory FET conducts excessively in the non-program mode since uncompensated holes generated as a result of the $p^+$-doping are accumulated in the channel region. Further, the excessive conduction occurs because the memory FET in the non-program mode is driven far into its nonconducting region for U-G2=0. Due to the programming, in accordance with the invention, of said memory FET, the barrier-type channel K is driven in unusual fashion still farther into the nonconducting region.

In FIG. 5, the curve G10 corresponds to the barrier-type characteristics of the memory FET constructed according to the invention and illustrated in FIG. 6, prior to programming. Due to programming 1, the memory FET assumes the more pronounced barrier-type characteristics corresponding to curve G1n. In order to switch this embodiment of the invention, after programming, to the conducting state, a particularly high positive voltage would have to be applied to the charging gate G2 as shown on curve G1n. This positive voltage must compensate for the effects of the negative charges stored on the floating gate G1, as well as the effect of the holes accumulated in the channel as a result of the $p^+$-doping.

For the reading of the aforementioned embodiment of the memory FET constructed according to the invention having a barrier-type channel in the non-program mode, one may feed to the charging gate G2 such a high positive potential applied between curves G10 and G1n that the source and drain region conduct reliably if the memory FET is unprogrammed, as shown on curve G10. However, the source and drain region K is reliably nonconducting if the memory FET is programmed, as shown on curve G1n.

An advantage in the aforementioned embodiment of the invention is the fact that both for programming and reading, comparatively high positive voltages are required, so that superimposed parasitic voltages and unwanted residual charges, particularly in the insulator Is, cause no interferences during the reading of programming. This embodiment is thus particularly noise-immune even if, through frequent discharges and reprogrammings of the floating gate G1, certain shifts occur, mostly of the curve G10 (cf. R in FIG. 5).

As indicated above, this memory FET with barrier-type channel is likewise suitable for constructing the matrix of FIG. 4, whereby in this case, due to the great noise immunity, even the unprogrammed memory FETs, after frequent quenchings and reprogrammings in the program and non-program modes, particularly for U-G2=0, are all reliably nonconducting. Similarly unambiguous and reliable are the signals read from the matrix. Moreover, the matrix designed in this way dissipates little power, because due to the noise immunity, all memory FETs, both in the program and non-program modes, are reliably nonconducting, despite fairly frequent quenchings and reprogrammings.

As noted earlier, the embodiments of the invention can also be quenched again, because the floating gate G1 can be discharged again by avalanche breakdown. For that, a voltage charging the junction for breakdown must be applied to the nonconducting p-n junction between substrate and drain. At the same time, a negative voltage or ground potential must preferably be applied to the charging gate G2. The charges generated by avalanche breakdown then discharge the floating gate G1. Also, by using appropriate compensating gate voltages at the charging gate G2 one can cause the channel, after the floating gate G1 has been quenched despite parasitic residual charges and similar interferences (cf. in FIGS. 2 and 5), to assume with greater reliability the characteristics desired for the non-program mode, namely, if the memory FET has in the non-program mode a barrier-type or enhancement-type or depletion-type channel. The quenching by electrical instead of by optical means will be detailed later.

Other possibilities for carrying out the channel injection will be discussed below.

FETs with an insulated floating gate, i.e., with n-channels or p-channels, whose channel-insulated gates have no non-electrical contact, have been known as such. Such FETs are, for example, described in U.S. Pat. No. 3,660,810 and West German Offenlegungsschrift No. 2 129 181, also by Tarui, IEEE Journal of Solid State Circuits SC-7, October 1972, No. 5, pp. 369–375, as well as in Proceedings of the 4th Conference on Solid State Devices, Tokyo 1972/Supplement to the Journal of the Japan Society of Applied Physics 42 (1973), pp. 158–166.

These FETs with an insulated floating gate are particularly suitable for use as a storage element in an electrically programmable read-only memory (ROM), since the charge on the gate, when the insulator is chosen properly, frequently does not change for years. Thus, the charge of the gate controls for long periods of time the line condition of the channel located between the source and drain region. Said FETs can be employed as storage elements, because one can influence the potential of the floating gate. As is generally known, the gate can be charged by applying appropriate voltages between the drain or the source region and the substrate, since a part of the charge carriers is heated in the nonconducting p-n junction, thus enabling these carriers to enter and pass through the insulation from underneath to reach the gate. Thus, in prior art FETs the high velocity of the charges passing through the insulator and necessary for charging the gate is achieved by applying the breakdown voltages to the nonconducting p-n junction between the substrate on the one hand and the drain or source region on the other. According to West German Offenlegungsschrift No. 2 235 533, page 16, paragraph 2, such charging of the gates of said FETs can likewise be accomplished by applying voltages between the drain and source regions.

If the source - drain voltage is too low for charging the floating gate, the gate potential does not change. Such relatively low source - drain voltages are employed for reading, that is, for testing the line condition of the channel, if the FET is used as an electronic storage. Since the condition of the FET constructed according to the invention can be read by means of relatively low source and drain voltages in the same way as in conventional FETs, the details thereof need not be given herein.

As generally known, the gate can likewise be discharged, as required, for example, by illuminating the insulator with ultraviolet light, causing the charges of the gate to drift across the insulator to the substrate.

The structure according to the invention described hereinbelow provides a way to heat part or all of the charge carriers making their way to the gate in the channel itself, instead of only in the nonconducting p-n junction.

In addition, it offers the possibility of charging the gate with hot charges by using very low voltages between the drain and source regions. At the same time, no additional gate to source voltage for stimulating the charging is needed.

This construction is based on a recent finding that by using a high field strength at a localized site in the conducting channel itself, i.e., between the drain and source regions along the length of the channel, the charge carriers on that location can be accelerated such that part of the carriers can make their way to the gate at right angles to the channel. They, therefore, proceed across the insulator as long as no excessively high negative anode potential is applied between the gate and the point of escape of the charges at the interface between insulator and channel. Generally speaking, it is even of advantage to apply an appropriate acceleration voltage between the gate and the point of escape corresponding to such a negative anode potential, because a number of carriers, for example, due to unevenness of the channel surface and to blow-induced deflections, also move in a direction vertical to the channel. These hot carriers can be generated by means of the longitudinal field strength in the chennel along, where possible, and in special cases also by such a longitudinal field strength in conjunction with the field strength existing in the nonconducting p-n junction.

A field effect transistor type of device is provided having an insulated floating gate, such that its channel located between the drain and source regions has an acceleration space in the form of a large structural inhomogeneity placed in that region and operating along the length of the channel.

This inhomogeneity may, for example, be formed by a localized thickening of the insulation between the channel and the gate, so that at this point of the channel fewer free charges are induced by the gate-channel voltage than elsewhere in the channel. Thus, as a result of the inhomogenity, there is formed at the adjoining site of the channel, containing only a few free charges, an acceleration space in which, due to the lack of charge, the longitudinal field strength in the channel is greater than elsewhere in the channel.

However, the inhomogeneity may also be formed, instead of by a thickening of the insulation, or even in addition to said thickening by a constriction of the channel. If this is done the channel width in the constriction amounts at the most to half the channel width of the remainder of the channel.

According to a technique disclosed in Solid-State Electronics 16 (1973), pp. 483-490 it is common knowledge to narrow the channel of FETs, the gates of which do not float. However, this prior art technique does not suggest the formation of an acceleration space for the purpose of charging a floating gate across the insulation. The acceleration of the charge carriers achieved by the invention is the greater within the constriction, and this acceleration increases the smaller the channel width in the constriction is made or the thicker the insulation at that point is made.

Very high field strengths occur along the length of the channel within the acceleration spaces produced in the foregoing manner, so that the carriers are considerably accelerated therein. The majority of "hot" carriers flow further along the length of the channel. Part of the hot carriers, however, can also be transferred across the insulation at right angles to the gate, charging it, if no excessive negative anode potential is applied between gate and acceleration space, but possibly even an additional acceleration voltage which, in turn, attracts the hot carriers. The gate can then be charged to generate between gate and acceleration space a negative anode potential of such magnitude that further transfer of accelerated carriers across the insulation is prevented.

Figure 8:
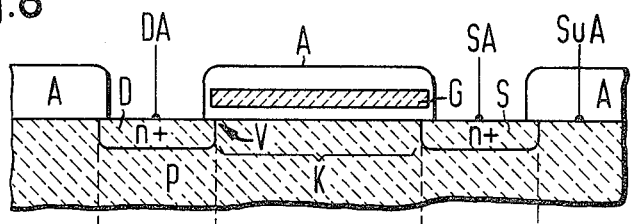
FIGS. 8 – 16 are schematic and cross-sectional views of a channel illustrating design parameters for the channel.

FIG. 8 is a schematic diagram of a further illustrative embodiment of the invention. Between drain region D and source region S there is a region K of the substrate in which the channel of this enhancement-type FET is formed by reason of the fact that the charge of the gate produces on the surface of the substrate region K by means of induction through the $SiO_2$ insulation, which in this case is, e.g., only 0.1 micrometer thick, a channel consisting of mobile charges. The shape of the channel, viewed from the bottom (see FIG. 9), thus corresponds to the shape of this part of the gate G (see FIG. 8) spaced only 0.1 micrometer therefrom and corresponding to the floating gate G1 in FIG. 1. Thus, by choosing the shape of the gate G one can establish the corresponding shape of the channel.

The FET illustrated in FIG. 8 has a n-channel, hence, n-doped source and drain regions. Above the substrate region lying therebetween or the channel K lies the insulated floating gate G completely surrounded by the insulation A. Gate G thus has no electric contact whatever with channel K; neither does it has a terminal over which an electric charge can be coupled to it from outside. The FET depicted in FIG. 8 thus has only a drain terminal DA and a source terminal SA, but no gate terminal.

Figure 9:
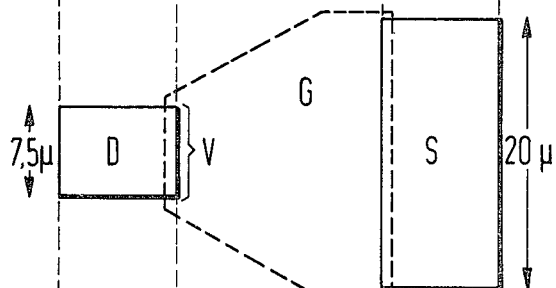
Figure 10:
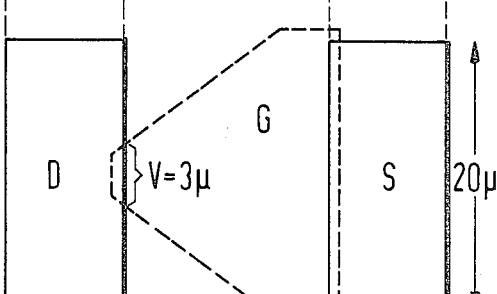
Figure 11:
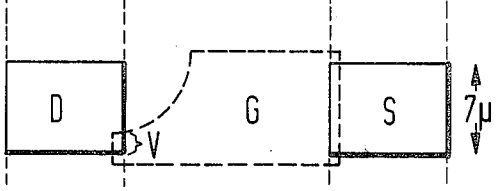

According to the invention, the channel K has an acceleration space V, which was only shown in the cross-sectional view of FIG. 8. The acceleration space V produced by a inhomogeneity can more readily be seen in FIGS. 9–11, which show various structures of such acceleration spaces V formed by constrictions. The structures in FIGS. 9–11 are likewise provided with dimensions. However, this does not restrict the invention merely to examples having the specified dimensions and special designs. In the exemplary embodiment shown in FIG. 9, the channel K has a trapezoidal shape by which a constriction V is provided (in this case, directly at the end of the channel in the vicinity of the drain region D). Here, the constriction is about 50% of the maximum width of the channel. In FIG. 10 the constriction V, which is likewise placed at the end of the channel in the vicinity of the drain region D, is particularly narrow, amounting only to 17% of the maximum width of the channel. In FIG. 11 the constriction V is placed asymmetrically.

If a voltage is applied between the drain region D and the source region S, a voltage gradient is produced in the channel K along the length thereof, that is, directed from the drain region D to the source region S, or vice versa, from the source region S to the drain region D. As a result, a particularly high voltage gradient, i.e., the longitudinal field strength in the channel, will occur localized in the constriction V and in the vicinity thereof. In the remaining sections of channel K the voltage gradient is smaller.

Due to the high voltage gradient in the constriction V, the charge carriers are greatly accelerated therein, that is, they are "heated" considerably. In the remaining sections of the channel K, the acceleration of the charge carriers is smaller because of the smaller voltage gradient; thus, the load carriers are "colder" in those channel sections.

The charge carriers heated up in the constriction V do not all drift along the voltage gradient, that is, toward the longitudinal axis of the channel. Specifically, if a potential is applied to the gate G which attracts the hot negative charge carriers sufficiently, particularly if the channel surface is also uneven or the charge carriers are deflected by collisions, then part of these carriers attracted by the gate G are transferred across the insulation A to the gate G, charging it. The charge fed to the gate is normally retained on the gate, since the gate is completely surrounded by the insulation A, so that the conductivity of the FET channel K is controlled by the effect of induction of the charge now stored on the gate G. The magnitude of the ohmic resistance of channel K serves as an indication that a corresponding charge is stored on the gate G or that no such charge is stored thereon.

The hot charge carriers transferred across the insulation layer onto the gate are generally electrons. Actually, to transfer high energy holes to the gate through the insulator is old in the art, but with the insulation materials presently in use this is done with very little efficiency, so that the charging of the gate with holes is much slower than with electrons. Hence, the FET according to the invention is generally provided with a n-channel which already contains more electrons than holes and thus allows the gate to be charged very rapidly.

The drain-source voltage for charging the gate could, in the example shown in FIG. 9, despite the relatively small constriction, be chosen to be about one-third lower than for the prior art FET with insulated floating gate, which had no constriction, but whose channel was equally long. In the dimensioning example, it is even conceivable that the charging carriers are not accelerated only in the acceleration space. To some extent, accelerated carriers might have produced impact ionizations in the adjacent p-n junction, resulting in the generation of carriers that make their way to the gate. Such a double use of the acceleration space is, above all, possible for p-channel FETs when hot electrons generated during impact ionization make their way to the gate.

Figure 12:
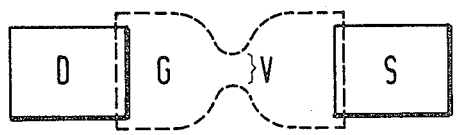
Figure 13:

Two additional exemplary embodiments are shown in FIGS. 12 and 13 in which the inhomogeneity is formed by constrictions V or V', for example, by providing in the regions B appropriate apertures or contractions in the center of the gate. In such structures, the acceleration spaces of which are formed by very narrow constrictions approximately midway between the drain region D and the source region S, the gate/acceleration-space voltage attracting the charge carriers to the gate can be produced with lower voltages between gate G and source S than are necessary for charging the structure shown in FIG. 9. This is due to the fact that in the structure of FIG. 9 a gate-source voltage is necessary which is at least substantially the same as the drain-source voltage, since the acceleration space has the same potential as the drain region D.

In the case of a n-channel FET, the inhomogeneity V may also be placed near the source region. In this case, the inhomogeneity should be particularly great to ensure that the charge carrier density, which is usually large at that point, does not compensate the accelerating effect of the inhomogeneity too greatly. Hence, the channel width in the constriction V should only be, e.g., 10% of the maximum width of the channel K. In this structure, it is of advantage to make the voltage between gate and acceleration space during the charging of the gate particularly low without at the same time fully interrupting the channel through lack of induction.

Thus, the inhomogeneity may be placed anywhere along the channel K, that is, anywhere between the center and the end of the channel.

Figure 14:

A special advantage is offered by structures that are symmetrically designed in reaction to the center of the channel. These are FETs designed according to the invention, the inhomogeneities of which lie in the center of channel K (FIGS. 12 and 13) or FETs which have, symmetrically disposed in relation to the center, two inhomogeneities, one to the left and one to the right of the center (cf. the inhomogeneity V1 and V2 in FIG. 14). Due to the symmetry of this structure, the gate of the FET can be charged both by voltages directed from the drain region D to the source region S and by equally high voltages directed from the source region S to the drain region D.

Basically, the teachings in accordance with the invention may be applied not only to enhancement-type FETs, but likewise, to depletion-type FETs where, as in the case of the enhancement-type FETs, charges (particularly electrons) are properly heated in the acceleration space as soon as free charges move therethrough. That is, as soon as there is an accelerating bias, there is a conducting channel between gate and acceleration space. The high field strength for the constriction V can be obtained with very low drain-source voltages by making the length of the channel between drain region and source region as short as possible, e.g., only a few micrometers or even less. This voltage reduction can be accomplished with any shape and with any location of the constriction in the channel K.

Figure 15:
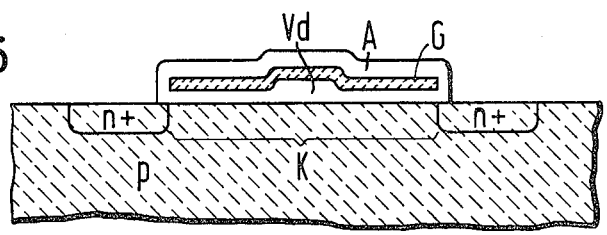

The inhomogeneity may likewise be achieved by means of a thickening (Vd) of the insulator A instead of by a constriction (V) of the channel K (FIG. 15). In the area of the thickening (Vd) the induction effect of the gate G is weaker than in other parts of the channel, so that in the channel where the thickening is located there are fewer high charge densities (i.e., higher longitudinal field strengths) than in other parts of the channel. The acceleration space is produced by the augmented field strength. The channel charge carriers generated therein can be transferred to the gate G through the insulator, primarily on the edge of the thickening Vd, where the insulator becomes thinner again. FETs having inhomogeneities formed by thickenings have approximately the same characteristics and advantages as FETs whose inhomogeneities are formed by above discussed channel constrictions. Thus, one can conveniently place the thickening anywhere along the channel.

If, in addition to the insulator thickening Vd, the channel constriction V described earlier (FIGS. 9-14) is placed at the same loaction, the longitudinal field strength in the accleration space increases considerably, so that very low voltages suffice to charge the gate G.

Figure 16:
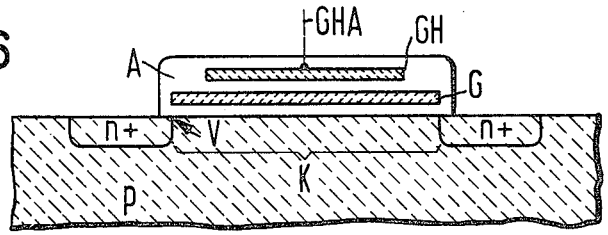

As shown in FIG. 16, an auxiliary gate GH may be placed above the floating gate G and coupled capacitively therewith. The auxiliary gate corresponds to the charging gate G2 shown in FIG. 2. At a terminal GHA any potential may be applied to the auxiliary gate GH. Hence, as needed, any potential can also be impressed on the capacitively coupled floating gate G via the terminal GHA, for example, to generate acceleration voltages or negative anode potentials of any magnitude between the floating gate G and the acceleration space in the channel. Thus, by means of the terminal GHA the charging of the floating gate G or the compensation of charges there existing can be controlled by means of hot charge carriers in the acceleration space, i.e., even if a given charge has already been placed on gate G.

The charges heated in the acceleration space, generally electrons, may also be used to quench, i.e., to discharge, the gate G if the gate G was previously charged with charges having an opposite polarity, e.g., by avalanche breakdown. Due to the great number of charges heated in the acceleration space, the discharging of the gate occurs more rapidly than if no accelerating space had been provided in the channel.

Using memory devices such as described hereinabove, the storage matrix in FIG. 4, described briefly above, will be described in greater detail. known in the prior art in which the storing FET has only one controllable charging gate and one special insulator that requires special operating conditions for the storing. See, e.g., the MNOS storage matrices in "Electronic Components," Oct. 27, 1972, page 1005, FIG. 6(a) together with page 1004, right-hand column, last paragraph — similar to insulators of a different kind on page 1004, FIGS. 4 and 5; further Wescon Technical Papers 16 (1972) Session 4/2, page 2, FIG. 2c and West German Offenlegugsschrift No. 2 011 794, FIG. 3a, together with page 6, last paragraph. A drawback of such MNOS FETs is that they store their information a few months only. In addition, during this period they cannot be read as often as required, since, otherwise, the erasing of their data would be accelerated very rapidly.

An electronic storage matrix embodied in the integrated circuit and having a multiplicity of electrically programmable memory cells, arranged into a matrix, with 2 FETs each, viz. one control and one memory FET, is described in Proceedings of the 4th Conference on Solid State Devices, Tokyo, 1972/Supplement J. Japan Society of Applied Physics 42 (1973), pp. 158-166, particularly FIGS. 1, 14 and 16. The memory FETs therein have an insulated floating gate and also a controllable charging gate. Both gates are capacitively coupled to each other and act on the main gap of the memory FET to which they are allocated. The additional control FET serves, during reading or programming, for the selection of the memory FET. Thus, two FET storage cells are involved here which are frequently employed for similar applications (Elektronik-Industrie 4-1973, page 53, center column, second paragraph; further, IBM Technical Disclosure Bulletin 15 (1973), No. 9, page 2922; Wescon Technical Papers 16 (1972), Session 4/2, page 3; Electronic Components, Oct. 27, 1972, page 1005; FIG. 6(b), and Solid-State Electronics 17 (1974), pp. 517-529, FIG. 21. However, in the last-mentioned memories the actual memory FET of the two FET memory cell has only one (insulated) floating gate, but no additional controllable charging gate.

In addition, storage cells have been known with more than two FETs each, one of which has a floating gate. For example, the three FET storage cell embodied in the integrated circuit described in IEEE Journal of Solid State Circuits, SC7, No. 5, October 1972 pp. 369-375, particularly page 371, FIG. 3, where three FETs are provided per storage cell. The memory FETs used here are electrically programmable, quenchable and machine-readable. Usually, such memory FETs are electrically programmable and machine-readable, but they are quenched via optical means (Proceedings of the 4th Conference on Solid State Devices, Tokyo 1972, cited above).

These storages provided with memory cells which, in addition to one or more control FETs, contain a memory FET with an insulated floating gate, have great advantages over the MNOS-FET memories, although they have more than one FET per memory cell. The can be read as often as one wishes and can store their information for many years. To a certain extent, they can even be quenched by electrical means. To be sure, they have the drawback that more than one FET is required for each memory cell, so that space requirements and reject rate are quite large in the fabrication of fairly large memories.

It should be noted, however, that such memories with floating gates apparently continue to be investigated by many researchers in this field, as evidenced by the many references and their often quite extensive bibliographies, and that such apparently mass-produced memories have been offered for sale by the firm of Intel (cf. the components 1702A, 1602 and 1601 of said firm).

The structure in accordance with the invention shown in FIG. 4 represents an advantageous simplification of the memories which contain FETs having an insulated floating gate. In the case of the invention, the number of FETs required for a fairly large memory matrix is reduced by one half as compared with prior are memory matrices, resulting in a corresponding reduction of the production cost and space requirements for the needed semiconductors. Moreover, the working voltages for the memory constructed according to the invention can be lowered. Also, the access time for the memory according to the invention is shorter than in prior art memories with FETs with a floating gate. Furthermore, the memory according to the invention can be read as many times are required, and it stores its information for many years.

The structure according to the invention is additionally based on the finding that an additionally provided charging gate of the memory FET containing the floating gate allows a dual use of the memory FET, because the memory FET which now has a floating gate and a charging gate can take over during programming and reading, and often even during quenching, the functions of the control FET connected in series in prior art memory cells, if the memory FET concerned can be quenched by electrical means. Thus, double use can be made of a single memory FET according to the invention, not only for storing but also for activating the storage cell, and no additional control FET is needed for each memory cell, although the belief has prevailed heretofore that memory cells containing a FET with a floating gate must contain at least one more storage FET. This is evidenced by the prior art and by the various components offered on the market.

This embodiment of the invention is based on an electronic memory device embodied in an integrated circuit and having a multiplicity of electrically programmable memory FETs, each having an insulated floating gate, and, in addition, a controllable charging gate. Both gates of each memory FET are capacitively coupled with each other and both gates act on the main gap of the associated memory FET. At least partially, the terminals of the charging gate, and/or at least partially, main gaps of the floating gates having the first terminals of the two terminals are electrically interconnected. The memory according to the invention is characterized in that each of the memory cells contains only one FET, viz. the memory FET.

FIG. 4 is a schematic diagram of a memory comprising one FET per memory cell. The memory thus comprises a multiplicity of electrically programmable memory FETs, each having an insulated floating gate and a controllable charging gate. Both gates of each FET are capacitively coupled to each other (FIG. 1) and either gate acts on the main gap of its memory FET. In the structure of FIG. 4, two of the three terminals of each memory cell are connected in a manner in itself known to a horizontal line and to a vertical line of the memory matrix. The third terminal in this case is connected to the common terminal So over which, as well as over the other two terminals of the storage cell, a working potential (e.g., ground potential E or the potential U) can be fed to all the memory FETs. Furthermore, it is possible to apply no working potential to the terminal So, allowing So to float. By proper selection of the potentials across the horizontal lines X and the vertical lines Y — e.g., fed line by line or column by column via special switches (T5, T6 in FIG. 4), it is possible to supply only a single memory cell, i.e., only a single memory FET among a multiplicity of memory FETs, with the working voltages which program, read or sometimes even quench it, depending on the type of FET (e.g., n-channel enhancement-type FET).

As is generally known, to program and to erase, high working voltages with predetermined polarity must be applied to the memory FET, while at the same time voltages that are not of sufficient magnitude for programming or quenching are applied to the other memory FETs.

If, for example, the memory FET T1 in the nonprogram mode is a n-channel FET of the enhancement-type and its programming, i.e., charging, of the associated floating shall occur in a manner in itself known (IEEE J. Solid State Circuits, SC7, No. 5, Oct. 1972, pp. 369-375), one can apply to the horizontal line X1 a negative voltage of sufficient magnitude to inject hot holes from a surface breakdown in the drain region of the main gap onto the floating gate. The floating gate is thus positively charged with holes sufficiently long until a negative anode potential is generated between the floating gate and the drain region, by which the charging of the floating gate with holes is interrupted. To generate the holes, a positive voltage of sufficient magnitude must additionally be applied to the vertical lines Y1. Although, over the lines X1 and Y1, a few of the programming voltages are also applied to the terminals of other memory FETs of the matrix, not all voltages necessary for the programming are applied concurrently to all corresponding terminals of said FETs. Thus, only the selected memory FET T1 of the memory matrix is programmed. Oftern it is of advantage to drive the terminal So with a floating potential so that channel currents, e.g., via T3, cannot drive via So.

Thus, it is no longer necessary in the case of the invention that one or even all the working voltages of each memory cell be applied over special control FETs allocated individually to each memory cell. In the memory cell constructed according to the invention, the memory FET at the same time takes over the function of the control FET, because the memory FET has its own controllable charging gate. That gate, only through capacitive coupling to the floating gate permits the programming, i.e., the charging, of the gate, but also the selection of the proper floating FET from the multiplicity of available floating FETs.

The charging gate of the memory FET placed in the memory in accordance with the teachings of the invention also permits the reading of the one FET storage cell without requiring an additional control FET per memory cell, because the potentials across the relevant horizontal line and vertical line in the case of the memory according to the invention must be applied only concurrently in accordance with the working read voltage conditions of the FET type employed in each case (e.g., n-channel enhancement-type FET). At the same time, potentials must be applied to the remaining vertical and horizontal lines that are too low in magnitude or the polarity of which is such, that they neither interfere with the reading, nor are of sufficient magnitude for quenching or programming.

If, for example, the memory FET T1 is a n-channel FET, in the floating gate of which holes have been stored previously during programming, ground potential E may be applied, for reading, to the horizontal line X1 and to the terminal So, but to the remaining horizontal lines X a negative potential may be applied that switches the memory FETs connected thereto into the nonconducting state. Moreover, in this case a low positive potential must concurrently be applied to the vertical line Y1. In accordance with the previously programmed line condition of the selected single memory FET T1, a signal now occurs at the vertical line Y and, hence, at the outlet of the memory output amplifier LV. This signal corresponds to the information stored in the memory FET T1.

The application of such working voltages for programming, reading, or even quenching may, for example, occur by means of a control unit St by applying appropriate voltages (e.g., US1, US2) to switches T5 and T6, allocated individually to the lines, to the control leads X and Y, and by applying ground potential E or other specified potentials U (in certain circumstances even a floating potential) to the selected memory FET concurrently with the other control signals, by connecting the terminal So to Ru or to Su. At the same time, the substrates of all the FETs are given ground potential, e.g., by connecting to ground a semiconductor carrier (not shown in FIG. 4 for reasons of clarity), whereby the FETs on the semiconductor carriers are embodied in the integrated circuit. The semiconductor carrier may, in turn, form a thin large-surface layer on an insulating base (e.g., sapphire or spinel), and the control unit St may be placed laterally thereof on the same insulating base. During reading, the reaction voltage arising at the main gap of the selected memory FET or the current flowing therethrough serves as an indication that the memory cell was or was not previously programmed. As noted earlier, this voltage or current may also (e.g., as shown in FIG. 4) be applied via switch T5 to an output amplifier prior to the transfer of the read signal to a load. Thus, even during reading, the memory FET, because it has a controllable charging gate to which an appropriate read potential is applied, has the function of the charging FET otherwise provided in two FET storage cells and, at the same time, the function of an information memory.

Since for electrical quenching of electrically memory FETs equally large voltages must be applied to the memory FETs as for programming, but with the polarities corresponding to the quenching conditions, it is not necessary to provide each memory cell with a special control FET to quench the memory cells electrically. To quench (for example, to remove the holes stored previously on the floating gate of the memory FET T1 as specified in the above cited issue of IEEE J. Solid State Circuits, SC7, No. 5, Oct. 1972, pp. 369–375), one may inject electrons from the main gap of the memory FET into the gate by the channel injection process described therein. This may be achieved by an appropriate (e.g., positive) potential at the horizontal line X1 and by an appropriate (e.g., positive) potential at the vertical line Y1, and by ground potential at the terminal So. At the same time, working voltages must be applied to the other lines X, Y for the non-selected memory FETs which neither quench the non-selected memory FETs, nor program them in an unwanted fashion. In the case of the FETs described in IEEE J. Solid State Circuits, SC7, No. 5, Oct. 1972, pp. 369–373, this is generally possible by the use of systems having fairly low positive voltages across the other lines, by applying ground potential E to the other control leads Y shown in FIG. 2 and a negative potential to the other control leads X.

As detailed earlier, it suffices to program memory FETs in a memory matrix by positively charging the floating gate and to quench again by means of negative charges, that is, by discharging the floating gate, by application of suitable potentials to the control leads X, Y and to the terminal So. In some cases, it may at first be disturbing that for the operation of the memory matrix one must also apply negative potentials for control in addition to ground potential and positive potential. However, because at least the switches disposed in the control unit St, possibly also the memory FETs themselves, are placed on an insulating base (e.g., sapphite), the channels of the various FETs can be insulated from each other, so that such potentials of different polarities can be applied without difficulty. The fabrication of FETs in a silicon layer on an insulating base (e.g., on a sapphire) is known in the art.

Since in the case of the memory cell constructed in accordance with the teachings of the invention the series resistor acting on the main gap of the memory FET is dispensed with, the working voltages at the main gap of each structure of the memory according to the invention can be made lower than if a series resistor (i.e., a memory FET) were available in each memory cell. Due to the elimination of the series element, the access time of the memory cell constructed according to the invention is shorter, since the read currents and voltages, due to the now relatively low internal resistance of the memory cell, are very rapidly adjusted to their final values. Due to the elimination of the control FETs, there are also fewer space requirements for the memory, and the manufacturing cost is likewise lower, particularly because the failure rate during the production is also reduced as a result of the relatively simple memory design.

In the case of the memory of FIG. 4, provision is also made for the arrangement of the memory cells in a matrix having two dimensions. The charging gates are each connected to control leads X of the first matrix dimension. The first terminals of the main gap are each connected to control leads Y of the second matrix dimension. The construction of such a two-dimensional matrix is very simple. Moreover, in the case of the structure of FIG. 4, provision is made that all second terminals of the main gap are connected to a common terminal So (which is connected to Su or Ru or is floating) instead of, for example, being connected column by column with special spaced-apart terminals. In this way, the application of a reference potential (in this case, ground potential E or potential U) is very simple.

The memory designed in accordance with the teachinges of this invention may also consist of a matrix containing only a single row or a single column of a two-dimensional switching matrix. One might say that in the case the matrix has one dimension. Several such structures may likewise be combined into a two-dimensional matrix by placing them side by side. During programming, the floating gates may be charged positively in a manner in itself known.

When charging the floating gate by channel injection in a n-channel FET which, for example, in the nonprogram mode is of the enhancement type, it suffices generally for programming and reading, to apply as gate potentials only ground potential and positive potentials to the control leads. This considerably simplifies the activation in the control unit St with n-channel FETs. When the memory FETs are being programmed with electrons, reaction voltages are generated across the memory FET T1, which are likewise applied between ground potential and the positive potentials employed. Thus, these reaction voltages, since they are always positive, can also be further processed outside of the memory matrix with n-channel FETs. Specifically, with this further development of the invention adequate insulation of the various FETs from one another and of the memory FETs from the control section is often possible even without placing them on an insulating base, but merely on a common semiconductor carrier. In this way the FETs disposed on the semiconductor carrier and operated solely with voltages of a single polarity are not subject to difficult-to-avoid short circuits over polarized junctions with the potential applied to the semiconductor carrier. In addition, the components connected externally to the memory may, in turn, be constructed in TTL circuit design or with the increasingly popular n-channel FETs, which likewise operate with positive voltages or substantially the same magnitude. Moreover, n-channel memory FETs programmed with electrons exhibit such a favorable ratio of the resistance of their n-channel main gaps in the program mode relative to their resistance in the nonprogram mode that the reaction voltages shown very clearly, i.e., very reliably, the information stored in the memory FET.

A further advantage of the use of such memory FETs programmed with electrons is that, despite the application of working voltages having only one (e.g., positive) polarity, during reading, current flows only through the selected memory FET and not through the main gap of the non-selected memory FETs. This will be the case if the latter have been programmed with electrons, that is, although during the reading 0 voltage is applied, e.g., between the charging gate and the source terminal of the memory FET. The energy consumption during reading is thus very low despite the modest circuit complexity.

All the cells of a row or even all the cells of the matrix may be simultaneously quenched. To do this, one may apply ground potential to the row $x$ to be quenched, positive potential to the remaining rows, and likewise positive potential to the common terminal So. Alternatively, ground potential may be applied to all the rows $x$ and positive potential to the common terminal So, that is, if the FETs in both cases have a n-channel.

Memory FETs often have the drawback, disturbing in many instances, that the gate voltages for the charging gate must be significantly high. Hence, the use of such floating FETs is often made difficult, because the remaining circuitry can generate the necessary high gate voltages for the charging gate only if special measures are observed.

It has been discovered that by judiciously dimensioning certain inherent capacitances in the memory FETs here in question that lower gate voltages can be used. The intrinsic capacitance, as known in the prior art, between the floating gate and the charging gate is at the very most as large as the intrinsic capacitance between the floating gate and the substrate of the memory FET. Thus, in these comparable prior art FETs, the change in potential across the floating gate, upon application of the gate voltage to the charging gate, is at the very most about half as large as the change of potential across the charging gate.

As a result of the increase in intrinsic capacitance in accordance with the further teachings of this invention between the two gates of the memory FETs in comparison with the capacitance between these two gates and the substrate, the potential of the floating gate can conveniently be made to vary by approximately the same amount as the amount by which the charging gate potential varies, as soon as gate voltages are externally applied to the charging gate. Thus as a result of the teaching in accordance with the invention, the swing of the applied gate voltage operates almost completely as a potential swing of the floating gate. For the programming and often also for the reading of the memory FET mode, the magnitude of the voltage between floating gate and substrate is particularly important, since this voltage has considerable influence on the charging of the floating gate with charges from the substrate or the drain region, as is also known in the prior art.

Figure 17:
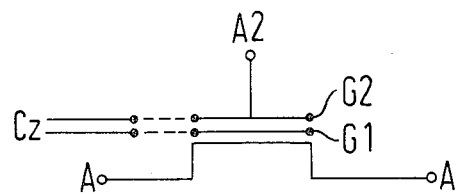
FIG. 17 is a schematic diagram of the inventive device illustrating resulting intrinsic capacitance.

FIG. 17 illustrates another principle of the invention, showing the main gap A-A of the memory FET. Above the channel of the main gap is placed the insulated floating gate G1, and thereabove the charging gate G2 controllable by terminal A2. FIG. 17 illustrates schematically, by showing a parallel capacitance $C_z$, that as a result of the teachings in accordance with the invention the intrinsic capacitance between the two gates G1 and G2 is considerably increased.

Figure 18:
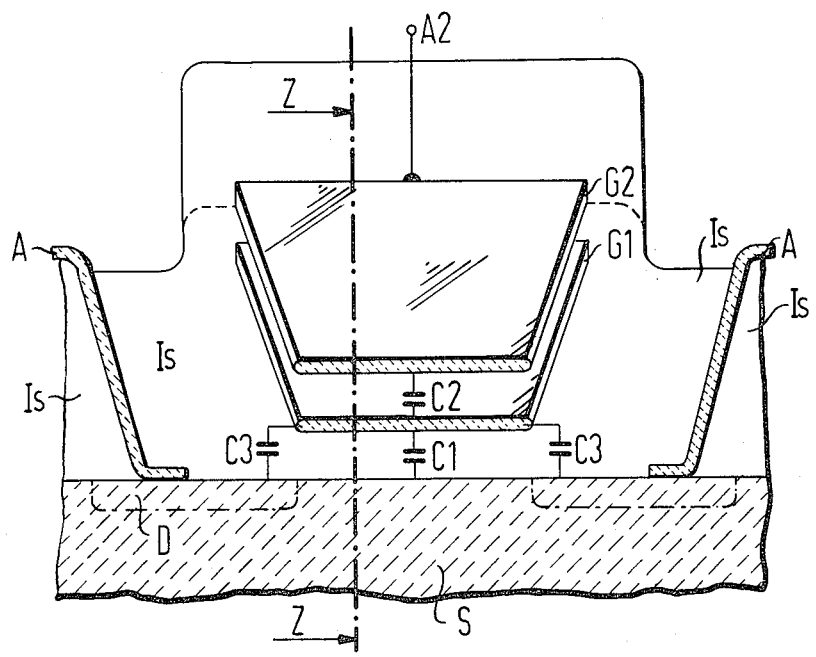
FIGS. 18 – 20 are partial cross-sectional views of the inventive device illustrating alternate arrangements for the gates G1 and G2 and the resulting intrinsic capacitances.

FIG. 18 is a cross-sectional view of the main gap of an embodiment of the invention. Above the substrate S is shown the floating gate G1, and thereabove the charging gate G2. The terminal A2 of the charging gate G2 is shown. In addition, FIG. 18 shows the drain region D and the source region of the memory FET together with their terminals A. The insulators Is insulate the gates from each other and from the substrate. According to the invention, the intrinsic capacitance C1 between the substrate S and the floating gate G1 is considerably smaller (e.g., 5 times smaller) than the intrinsic capacitance C2 between the two gates themselves. This dimensioning of the intrinsic capacitances may, for example, be achieved by mutually overlapping of the gates.

Figure 19:
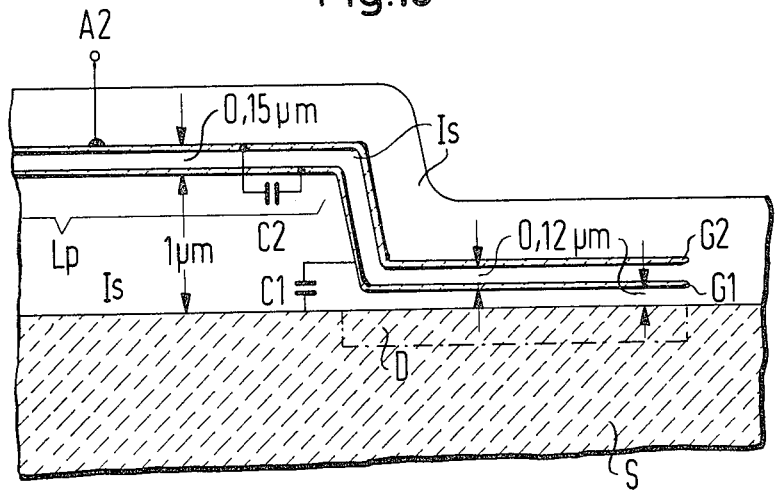

FIG. 19 is a cross-sectional view of the sectional plane Z-Z shown in FIG. 18. FIG. 19 illustrates by means of similar reference symbols that above the substrate the two gates G1 and G2 are spaced a distance of approximately 0.1 micrometer from each other. The two gates have mutually overlapping portions $L_p$ shown in FIG. 19. Due to this overlap of the lateral portions of the two gates, the intrinsic capacitance between gates G1 and G2 is considerably larger than the intrinsic capacitance of the prior art gates not so constructed. The portions $L_p$ are spaced a relatively large distance (here 1 micrometer) from the surface of the substrate S. The overlap of portions $L_p$ may be regarded as a shunt capacitor, the plates of which are connected in parallel to the two gate regions placed directly above the source and drain region, whereby, however, the parallel-connected shunt capacitor $C_z$ (FIG. 17) formed by the portions $L_p$ is embodied in the integrated circuit and forms an integral part of the memory FET itself.

In the embodiment of FIGS. 18 and 19 is shown a storage capacitor wherein the intrinsic capacitance C2 between charging gate and floating gate is essentially formed by the intrinsic capacitance of the overlap of portions $L_p$ of the two gates disposed laterally outside of the source and drain region above a thick oxide layer.

A particular advantage of this teaching in accordance with the invention will be described with reference to FIG. 19 in conjunction with FIG. 18. The intrinsic capacitance C3 between floating gate G1 and drain region D or the source region of the memory FETs (see FIG. 18) sometimes has an unfavorable influence on the performance of prior art memory FETs, because the potential of the floating gate G1 is varied by the intrinsic capacitance C3 during the programming or reading of the memory FET, that is, when there are variations in the potentials of the drain or source region. In the case of the memory FET according to the invention, however, the total capacitance between the two gates and the substrate is increased because of the high intrinsic capacitance C2 and the three dimensional enlargement of the gate.

Moreover, in the case of the FET according to the invention, a predetermined potential may be applied externally to the charging gate G2 via its terminal A2, even during the programming and reading of the memory FET, so that the potential of floating gate G1 is essentially only determined by the potential applied externally via terminal A2, as well as by the charge stored on gate G1. It is, however, determined only slightly by the capacitive coupling over the intrinsic capacitance C3. Thus, in the case of the invention, the intrinsic capacitances C3 are only slightly less effective than in comparable prior art FETs.

Figure 20:
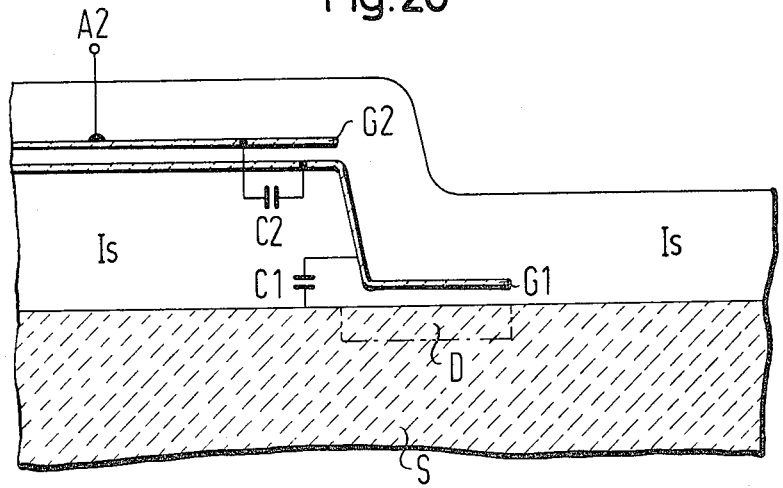

FIG. 20 shows another embodiment of the invention. Here, too, the two gates contain gate portions $L_p$ as in FIG. 19 and the overlap of these portions form an essential part of the intrinsic capacitance C2 between the two gates. However, in contradistinction to the structure shown in FIG. 19, provision is made in the structure of FIG. 20 that the charging gate G2 acts capacitively only slightly on the floating gate, as a result of the overlap laterally outside of the source and drain region. This occurs because the charging gate G2 is only slightly placed away from the source and drain region in the immediate vicinity of the floating gate G1, that is, slightly above the portion Lp of the floating gate G1. However, the charging gate G2 contains no more regions located immediately above the source and drain region of the floating FETs.

Generally, the structure of FIG. 20 is easier to make compared to that of FIG. 19 since prior art integrated circuit techniques can be used. Also, at the fabrication stage, the adjustment of the mask for the charging gate G2 immediately above the source and drain region is sometimes not easy. The structure of FIG. 20 is therefore easier to make than that of FIG. 19 due to the greater manufacturing tolerances.

However, compared to the structure of FIG. 20, the structure of FIG. 19 has the advantage that the intrinsic capacitance C2 between the two gates G1/G2, among one another, is still larger than in the comparable structure of FIG. 20, because also the intrinsic capacitance between the gate regions immediately above the source and drain region in the structure of FIG. 19 is used twice.

The invention is not limited to specific FET-channel types, since it can be employed both with n-channel and p-channel FETs. The FETs may alternatively be of the enhancement or depletion type. The FETs may also be designed such that they can be quenched electronically or, e.g., by exposure to ultraviolet light radiation or X-rays.

Generally, the discharge caused by optical means of the charged (i.e., programmed) floating gate of the known memory FETs have been disclosed in the prior art. In addition, the discharge caused by electrical means, viz. either by avalanche breakdown or by a special form of channel injection, have been described, that is, by means of compensating charges emitted either during avalanche breakdown from the p-n junction between channel and drain or source charged for breakdown or, in the case of channel injection, for example, from extremely low-charge region within the channel switched almost into the nonconducting state (IEEE J. Solid State Circuit SC7, No. 5, Oct. 1972, page 370, FIGS. 1 and 2 with accompanying description). In the two known kinds of discharge, these emitted charges make their way to the floating gate across the insulator.

However, during the avalanche injection process, the loss of energy, namely, the dissipated heat generated in the avalanching p-n junction are extremely high, i.e., the efficiency during quenching is small. The electrical quenching can occur only slowly. The same holds true for the use of channel injection for quenching. In these two discharges as known in the prior art great losses occur in the source and drain region. Thus, due to the large amount of dissipated heat in this main gap, simultaneous quenching of a great many or even of all the programmed memory FETs of the memory is made difficult, if not impossible, since this may lead to operational faults and, even to the destruction of the memory FETs.

In addition, there are other electrical discharge possibilities for programmed memory FETs.

The Fowler-Nordheim tunnel effect has been described in the publication J. Applied Physics 40 (1969), pp. 278–283, according to which electrical charges, above all, can be transferred across specified insulators, e.g., $SiO_2$, whereby at all events with layer thicknesses between a few hundred A up to 1500 A there is an apparent linear relationship between the $SiO_2$ layer thickness and the necessary driving voltage. The driving voltage may be a direct voltage, the floating gate being formed from a metal layer or from a semiconductor layer, more particularly from polycrystalline silicon.

The use of the effect for quenching floating gates of p-channel memory FETS has been described in Proceedings of the 4th Conference on Solid State Devices, Tokyo, 1972, Supplement J. Japan Society of Applied Physics, 42 (1973), page 163, left-hand column, next to last and last paragraphs. However, in this case, discharge was probably only achieved as a result of avalanche breakdown from a nonconducting p-n junction, or perhaps also, by means of the gate surface effect described hereinbelow. That is, a special heating of charges in the floating gate itself as a result of an extinction voltage pulse is used. This publication recommends as driving voltages impulsive extinction voltages with correspondingly high voltage valuse.

However, by utilizing the Fowler-Nordheim tunnel effect the discharge can easily be achieved by means of direct voltage between the floating gate and the channel or source or drain on the other. Thus, between the floating gate and the main gap, the application of direct voltage for quenching the floating gate can actually be carried out very easily. Thus, this advantageous application of direct voltage as an extinction voltage for programmed memory FETS has not yet been reported in this publicaton, but instead an application of extinction voltage pulses that is atypical for this tunnel effect, which refers to the application of another discharge effect.

Of surprising effect is also the finding that a peculiarity of the floating gate of programmed memory FETS by means of the Fowler-Nordheim tunnel effect lies in the fact that charges drift in a direction away from the floating gate across the insulator to the channel or drain or source. Thus, a current of charges of the opposite, i.e., second, polarity exiting from the source or drain or channel and drifting in opposite direction is superimposed on the drifting current of charges of the first polarity. It is further transferred to the floating gate across the insulator.

This peculiarity thus lies in the fact that in contrast to the two known discharges by electrical means described above, not only currents of charges penetrate the insulator towards the floating gate so as to compensate the charges stored thereon, but that, above all, also currents of charges that have heretofore charged the floating gate pass through the insulator in a direction away from the floating gate.

In addition, the other type of discharge previously described and referred to as gate surface effect was reported in the Journal of Electrochemical Society of Solid State Science and Technoloty, 119(1972) pp. 597 to 603 and Eleventh Annual Review of Physics 1973, pp. 163–169. The floating gates involved herein are made from semiconductor material, more particularly from polycrystalline silicon, which may also be wholly or partly p-doped. In this case, the discharge occurs not with the aid of direct voltages, but with the aid of extinction voltage pulses. These pulses are applied between the floating gate and the source or drain or channel, so that accelerated charges of opposite polarity, more particularly electrons, can drift to the main gap through the insulator in a direction away from the floating gate. Thus, due to the electron drift a heretofore charged, i.e., programmed, floating gate can be electrically discharged. Generally, a multiplicity of such extinction voltage pulses (i.e, a train of extinction voltage pulses) are necessary for completely quenching the originally programmed memory FET, since normally only a small portion of the stored charge leaks with every extinction voltage pulse.

Special experiments with memory FETs having floating and charging gates have shown that particularly during the (preferably steep) leading edge of the applied extinction voltage pulse of opposite polarity in the floating gate (preferably to be chosen with a thickness of, say, 10,000 A) a separation takes place of the negative and positive charges freely moving therein. The positive holes, which are particularly numerous in the case of p-doping, flow to the floating gate surface facing away from the channel (i.e., directed toward the charging gate), and the negative electrons flow to the other floating gate surface disposed on the opposite side and facing the channel. This very rapid separation of the charges at first compensates only inadequately the high field strength within the semiconductor layer of the floating gate, especially on the floating gate surface facing the channel and on which a depletion zone, i.e., with respect to holes, is created. With an adequate amplitude of the extinction voltage pulse this uncompensated field strength may still be so strong that free electrons moving on the surface are accelerated in a direction away from the surface across the insulator to the main gap, i.e., to the channel or drain or source, in such a manner that they leave the floating gate and can pass through the insulator. Since the exit energy necessary for the leakage is clearly less for electrons than for holes, electrons can exit more easily from the floating gate than holes. Hence, the gate surface effect is preferred for discharging floating gates that heretofore have been charged negatively. Normally, still within the extinction voltage pulse duration, e.g., shortly after the leading edge of the pulse, the field strength in the floating gate heretofore uncompensated nevertheless collapses automatically. This is probably due to the fact that in the floating gate an adequate number of new free charges are rapidly generated which more or less compensate the field strength. Thus, as a result of this rapid collapse of the field strength, there appears normally only in the region of the leading edge of the extinction voltage pulse a short-duration leakage of parts of the stored charges, as in the case of the Fowler-Nordheim tunnel effect, in a direction away from the floating gate towards the channel or drain or source.

One or even both effects for quenching the charged floating gate of the programmed memory FETs by means of charges drifting from the gate, viz. the gate surface effect and perhaps also the Fowler-Nordheim tunnel effect, have apparently been utilized for the memory FET described in West German Offenlegungsschrift No. 2,356,275. However, both effects are generally superimposed on each other. In this publication, these two effects are neither described nor is a distinction made between them. Likewise, nothing has been revealed about the heat losses in the case of such electrical quenching.

In a further embodiment constructed according to the invention an electrically repeatedly programmable, as well as electrically quenchable memory FET is provided. The dissipations fed to the FED electrodes and required for the quenching of programmed memory FETs by electrical means are reduced to a minimum. Even if a multiplicity of memory FETs in accordance with the invention are placed in an integrated memory, or even in all the programmed memory FETs of this memory, the losses of energy and, hence, the harmful heat losses and the permissible minimum expenditure of time for quenching, are very small. The amount of circuitry and production effort needed therefore shall be minimal. Special experiments have shown that the Fowler-Nordheim tunnel effect and the gate surface effect are particularly suitable for that in contrast to the avalanche breakdown and channel injection which require great power dissipation.

In addition to being based on results obtained from the scientific research of discharges, this aspect of this invention is also based on the finding that when discharging by means of the Fowler-Nordheim tunnel effect, and/or gate surface effect, heat losses are essentially only produced by the relatively weak currents passing through the insulator if the substrate of the memory FET is floating. If the memory FET is part of a large memory chip with electronics additionally placed thereupon and controlling the memory, then, according to the teachings of the invention, only weak currents will flow in the main gap (e.g., from the source to the substrate), and these generate only a very small additional amount of dissipated heat.

In the case of electrical quenching under avalanche breakdown condition or by using channel injection, extremely great heat losses are produced in addition to those produced in the insulator, because in the case of current transport by these two last-mentioned emissions, in addition to currents discharging the floating gate, very heavy currents must be generated within the main gap to bring about the discharge of the floating gate. With these emissions extinction voltages triggering strong channel currents must be applied between the drain and the source or between the drain or the source and the channel, so that, at least in parts of the main gap, currents will flow that are considerably stronger than those provided for by the invention.

Thus, it is essentially a function of this structure to apply only the extinction voltage directly causing the leakage of stored charges between the charging gate, and, hence, also the floating gate, and the channel or drain or source so as to bring about the quenching. In this case the term "drain" always refers to the polarity of the voltage over the main gap during the electrical programming using avalanche breakdown or channel injection, but not to the polarity of the voltage over the main gap during the quenching. The advantageously little expenditure of dissipated heat detected only recently through special scientific effort is thus applied.

In addition to the electrical programming and quenching of the memory FETs, repeatable several times, this structure specifically permits a reduction in the time used for the electrical quenching of the memory FET so that, due to the small amount of dissipated heat, simultaneously many or even all memory FETs, constructed in accordance with the invention, of a memory can be quenched electrically, e.g., within a few milliseconds or seconds with very little expenditure of energy. In contrast quenching with optical means as known in the prior art requires many minutes. Additional technical effort for the invention is very small.

There are in particular two different solutions, viz. the FowlerNordheim tunnel effect and the gate surface effect; the latter may also be used simultaneously with the former. Both solutions are characterized in that the charged, i.e., programmed, floating gate is discharged by electrical means using an extinction voltage applied between charging gate and main gap. Discharge is brought about by an effect that causes electrons stored in the floating gate and accelerated by the extinction voltage in a direction away from the floating gate into the insulator between floating gate and main gap to flow off from the floating gate across the insulator to the main gap, i.e., to the channel or drain or source. To achieve this the extinction voltage of corresponding polarity is applied between the charging gate and the region of the main gap toward which the discharge is to take place. At least, the potential of the drain or that of the source toward which no electrons migrate can float during the quenching.

The memory FET shown in FIG. 21 is programmable with the aid of channel injection. To make channel injection possible, somewhere in the channel between drain and source, preferably in the vicinity of the source, there may be placed an acceleration space operating along the length of the channel. The acceleration space may be formed by a large inhomogeneity in the construction of the channel as discussed hereinabove, for example, by a narrowing of the channel or a thickening of the insulator above this location of the channel. The current Ke charging the floating gate G1 (FIG. 21) may be generated using channel injection, i.e., specifically in an acceleration space at location V of the channel shown in FIG. 21.

The current Ke is a current of electrons, which is normally the case with channel injection, so that during programming the insulated floating gate G1 is charged negatively. The insulator Is having the thickness $x$ between the floating gate G1 and the channel forms a barrier that must be overcome during the electrical quenching of the storage.

In accordance with the principles of the invention, provision is made that the charged, i.e., programmed, floating gate G1 is discharged by electrical means, that is, by means of a extinction voltage applied between the charging G2 and the main gap by an effect that accelerates electrons to the main gap. This effect may particularly be the Fowler-Nordheim tunnel effect or the gate surface effect, whereby at least the drain or the source is floating. As a result of this effect, electrons stored in the floating gate G1 and accelerated by the extinction voltage in a direction away from the floating gate into the region $x$ of the insulator, migrate across the insulator $x$ or Is to channel K or drain D or source S. In the presence of a floating substrate, only the current generated between the floating gate and the main gap are responsible the dissipated heat, since no significant additional dissipated heats are required for quenching by currents flowing along the length of the main gap.

The memory FET shown in FIG. 21 may constitute a single memory cell of a memory. Since in accordance with the teachings of the invention, only small losses of energy result, a great many, or even all, the memory FETs of said memory can be quenched concurrently, and rapidly, by electrical means without overheating the memory or the single FET. Thus, in accordance with the invention, even a very large number of the memory FETs of the memory can be quenched simultaneously with very little dissipation of heat and very little technical complexity, thereby saving time, cost and energy. Thus, the invention is an advantageous development of the memory FET described hereinabove, because the quenching thereof is made very simple.

It has been demonstrated tht due to contamination (often observable) of the insulator both when using the Fowler-Nordheim tunnel effect and the gate surface effect for quenching the floating gate, it is frequently advisable to permit the electrons stored in the floating gate G1 to migrate to the main gap region (e.g., source S) over which initially no programming of the floating gate took place.

In the exemplary embodiment illustrated in FIG. 21, the programming takes place within the channel, that is, in the vicinity of the drain D by the discharge current Ke. The discharging of the floating gate programmed negatively with electrons, as shown in FIG. 21, by the discharge current Kd, takes place in the direction of the source S, that is, into a region of the insulator which is quite remote from the region of the current Ke. As a result, the insulator Is is less heavily contaminated in its region between the floating gate G1 and the channel with each reprogramming and discharge of the floating gate than if the programming and quenching or discharging of the floating gate were to occur over the same region in the insulator Is. The teaching to permit the electrons, during quenching, to migrate to the main gap region over which the programming of the floating gate does not take place, has the advantage that the floating gate and thus, the memory FET, can be reprogrammed more often by electrical means than would otherwise be the case.

It is of advantage to permit the electrons of the floating gate to migrate to the source S during quenching, that is, to permit the drain to float. This has two other advantages. First, the distance between the two regions in the insulator Is over which the programming and the quenching occur are particularly large and, thus, the danger of contaminating the insulator Is is very small. Second, in accordance with the invention, programming with very little expenditure of energy is also possible due to the frequently very short distance between the acceleration space in channel K and drain D.

Thus, the migration of the electrons heretofore stored in the floating gate G1 is caused by applying the extinction voltages of such polarity that the electrons stored in the floating gate during programming are accelerated toward the main gap. The extinction voltages may, for example, be applied between charging gate G2 and source S of the memory FET, which causes electrons heretofore stored in the floating gate G1 to migrate to source C. Since this source region is n-doped, the electrons can migrate over the aforementioned region.

The extinction voltages may also be applied between charging gate G2 and drain D, which will cause electrons heretofore stored in the floating gate G1 to migrate to drain D. Thus, by proper application of the extinction voltages, the electrons heretofore stored in the floating gate can be made to migrate to the region of the main gap that has n-doping. One advantage of permitting the stored electrons, in accordance with the invention, to migrate to the main gap instead of to charging gate G2 lies in the fact that in the invention very low voltages between the two gates G1 and G2 are permissible, that is, a particularly high intrinsic capacitance between the two gates in comparison to the intrinsic capacitance between the floating gate G1 and channel K is permissible.

As noted above, extremely low gate voltages across the charging gate G2 are sufficient for reading, programming, and even for quenching, between charging gate G2 and main gap, because a swing of the voltage across the charging gate G2 operates almost as fully as a voltage swing of the floating gate.

The extinction voltage may, for example, be a direct voltage applied between charging gate G2 and channel K or drain D or source S. The extinction voltage may, however, also be a pulse train applied between the charging gate and channel K or drain D or source S. Whether a direct voltage or an alternate voltage shall be applied depends in particular on whether mainly the Fowler-Nordheim tunnel effect or the gate surface effect shall be applied for the quenching. If the Fowler-Nordheim tunnel effect is applied, both kinds of voltages can be used, preferably direct voltages, whereby during the entire application of the extinction voltage the discharge currents flow from charging gate G1 to main gap until all electrons that can be made to migrate by the direct voltage have migrated from floating gate G1. However, it was also noted that by applying pulse trains of equally high amplitudes the discharge by means of the Fowler-Nordheim tunnel effect could occasionally be accelerated, probably due to the simultaneous occurrence of the gate surface effect. Hence, even if this effect is utilized, one can often apply to advantage extinction voltage pulse trains or a direct extinction voltage with superimposed pulse trains between charging gate G2 and the channel K or drain D or source S.

As noted hereinabove, the discharge may also occur largely with the aid of the gate surface effect, that is, by the application of extinction voltage pulses having adequately steep leading edges and adequate amplitude, e.g., at pulse repetition rates of 100 kHz to 1 MHz with a pulse duty factor 1 : 1. These pulses are applied between the charging gate G2 and the region of the main gap, into which the electrons heretofore charged in the floating gate G1 are to migrate. The floating gate consists, e.g., of polycrystalline silicon that is p-doped. By applying such extinction voltage pulses, as illustrated in FIG. 21 and described hereinabove, the charges in the floating gate G1 are separated. However, the separation is not adequate for fully compensating the field strength initially produced by the extinction voltage pulse in the floating gate G1. In particular, on the gate surface turned toward the channel and enhanced with the electrons stored for the programming, there remains a depletion zone with respect to the majority charge carriers, i.e., a residual uncompensated field strength, so that the electrons heretofore stored therein and to be removed from the floating gate are accelerated toward the proper region of the main gap. Thus, they leave the floating gate G1 and pass through the insulator Is in the region x and can flow off into the proper region of the main gap. Due to the rapid breakdown of the residual uncompensated field strength on the floating gate surface, there must, as a rule, be applied for the complete discharge of the floating gate G1, not only an extinction voltage pulse, but also a larger train of such pulses.

Compared with the application of the gate surface effect, the application of the Fowler-Nordheim tunnel effect has the advantage that the quenching of the heretofore charged loading gate can occur in a single process, due to the applicability of direct extinction voltages. In contrast, if the gate surface effect is applied with fast rise time leading edges, lower extinction voltages are often adequate. This is particularly useful in many integrated storages, since their electronics can often supply only relatively low voltages for the operation of the memory with relatively little technical complexity.

If it is desired to use direct voltages for quenching the programmed memory FET, it is often convenient to generate the extinction voltage by a constant potential (more particularly ground potential) applied to the floating gate G2 and by another constant potential fed by the source. In this case, the floating gate G1 can be discharged such that it will approximate ground potential later. With appropriate selection of the amplitude and/or duration of the extinction voltage, one can achieve with this operating mode approximately either such a complete discharge or an excessive discharge of the floating gate G1. Generallym after the discharge one would like to have on the floating gate a well-defined potential that, for example, is identical with the potential across the charging gate G2, source S, drain D and channel K, if the same potential is applied across the charging gate G2, source S, drain D and channel K. If excessive charge would leak off from the floating gate G1, then not only would such a complete discharge of the floating gate G1 be brought about but, in effect, a reprogramming of the floating gate G1 having a potential of opposite polarity would take place which, generally at least, is not desirable. Because by applying direct voltage of appropriate amplitude and duration as an extinction voltage, the charging gate G2 is approximately at ground potential, such an excessive discharge (i.e., programming) of opposite polarity can largely be avoided, whereby a slight deviation from the ideal discharge aspired to of the floating gate is frequently innocuous or only slightly detrimental.

However, by applying a d.c. voltage as extinction voltage with a potential of the charging gate G2 that differs greatly from ground potential, one can without difficulty obtain selectively a different final state of the discharge of the floating gate G1, if such different discharge state is desired.

Whatever the discharge state aspired to may be, in any case the application, in accordance with the teachings of the invention, of the Fowler-Nordheim tunnel effect is of advantage, because with a comparatively low extinction voltage amplitude only a relatively small amount of dissipated heat is generated. The application of the avalanche breakdown process or channel injection for quenching the floating gate G1 would, in addition to the dissipated heat, also cause a great amount of heat to be lost, at least in parts of the main gap of the corresponding memory FET.

The same holds true for the application of the gate surface effect for quenching the floating gate. In this case, too, the non-program mode of the floating gate G1 can in like manner, depending on the need, be defined differently. Depending on what potential is applied to the charging gate G2 and how the slope of the leading edge is selected, duration and amplitude of the extinction voltage pulses, as well as the number of them, a different discharge state of the floating gate is achieved. Thus, with the aid of the gate surface effect any desired discharge state of the floating gate G1 can be obtained. Specifically, the extinction voltage can be generated by means of a constant potential applied to the charging gate G2, more particularly ground potential, and by voltage pulses applied to, e.g., the source. The pulse train of the extinction voltage produced thereby causes the selected quenching of the floating gate, that is, through leakage of the charges stored heretofore, in this case to source S.

If a very long uninterrupted train of such extinction voltage pulses is applied and the charging gate potential is appropriately selected, e.g., identically with the drain potential applied to the ground potential, a final state of the potential of the floating gate G1 can finally be obtained owing to the very great number of extinction voltage pulses that can be reproduced fairly well and, in addition, can be defined almost at random, depending on the choice of the floating gate potential applied simultaneously and of the extinction voltage pulse amplitude.

In order to apply the Fowler-Nordheim tunnel effect to very great advantage, it is often advisable, especially in the case of n-channel memory FETs that are programmed with channel injection, that is, by charging the floating gate negatively, to choose a specified optimum insulator thickness x.

The thickness x must often exceed a given lower limit to avoid certain problems, e.g., to ensure that the charged floating gate, owing to the conductive connection of the drain of the memory FET to the drain of another memory FET just being programmed during an avalanche breakdown condition, is not partially discharged again. Hence, in the example shown if, e.g., $SiO_2$ is selected as insulator, it is usually of advantage to make the thickness x of the insulator exceed 400 to 500 A.

FIG. 22 illustrates the criteria for selecting the lower limit for the insulator thickness x. This FIG. 22 is a diagram, on the x-axis of which is shown the logarithm of the insulator thickness x. The logarithm of the effectively operative extinction voltage U between the floating G1 and the main gap region (e.g., S or D) into which the electrons of the floating gate G1 shall migrate that must be exceeded during quenching is shown in the y-axis. The curve F1 illustrates by reason of its slope of about 45° that with this insulator (here $SiO_2$) there is for the Fowler-Nordheim tunnel effect a substantially linear relation between the insulator thickness x and the extinction voltage U. Curve F1 is intersected by curve F3 at the lower limit. Curve F3 resulted, e.g. with $U_D=15V$, $U_{G1}= =10V$ in a non-selected already programmed cell Z1 of a special illustrative structure during the programming of the adjacent cell Z2, which was connected to the same vertical line connected to the drain. As long as F1 lies below F3, cell Z1 is partially quenched during the programming of cell Z2. The optimum insulator thickness x is thus greater than this lower limit.

It has been shown that often the insulator thickness x also has an upper limit, so that the insulator thickness x must be chosen to be under that upper limit, because the insulator thickness x must fall below the upper limit at which, e.g., a strong avalanche breakdown condition sets in between the source and the substrate under bias, or at which below the values selected for the application of the d.c. voltage the quantities of electrons migrating from the floating gate by means of the Fowler-Nordheim tunnel effect are approximately as large as the quantities of holes flowing to the floating gate G1 under avalanche breakdown condition in the nonconducting p-n junction between drain D and channel K. If $SiO_2$ is used as insulator Is, this upper limit lies generally at about 1200 A. At this upper limit, as many holes Ke flow under avalanche breakdown condition with simultaneously strong heating of the main gap to the heretofore charged floating gate G1 as electrons Kd leak off concurrently from said floating gate G1 to the main gap of the memory FET, more particularly to the source, as a result of the Fowler-Nordheim tunnel effect. If the insulator thickness x exceeds this upper limit, the current of holes (Ke) generated in this example during an avalanche breakdown condition flowing from the relevant p-n junction between drain and channel to the floating gate G1 exceeds the current of electrons (Kd) leaking off from the floating gate G1 as a result of the Fowler-Nordheim tunnel effect. Instead of obtaining in the desired manner a discharge Kd of the floating gate with the aid of the Fowler-Nordheim tunnel effect, a discharge takes place of the heretofore negatively charged floating gate G1 by the compensating current of holes (Ke) generated during an avalanche breakdown condition accompanied by a great loss of heat.

Furthermore, it is generally advisable to make the insulator thickness $x$ as small as possible so that the extinction voltage amplitude required for the quenching is minimal, e.g., about 40 V. If necessary, such low voltages can more easily be supplied from the electronic circuitry controlling the storage. Thus, the layer thickness should be slightly more than the lower limit of the thickness to make such low extinction voltages possible.

Curve F2 which, in accordance with the usually quadratic dependence of the relevant function, is inclined at about 22° against the x-axis, and corresponds to the dependence of the minimum value of the voltage U between the floating gate G1 and the drain D (y-axis) on the layer thickness $x$ (x-axis) with respect to the generation of the current of holes (Ke) produced during an avalanche breakdown condition. The point of intersection of curves F1 and F2 yields the upper limit of the insulator thickness x; above it the current of holes (Ke) generated during an avalanche breakdown condition exceeds the desired discharge current Kd.

Generally, the optimum insulator thickness $x$ lies as far as possible below the critical upper limit for the layer thickness $x$ at which the curves F1 and F2 intersect each other. In the example shown in FIG. 22, the optimum layer thickness $x$ is about 600 A according to the specific number values indicated therein, whereby one can go slightly below or above it without affecting the optimum significantly.

As noted earlier, in order to quench the memory FETs with the aid of the gate surface effect it is advisable to make the floating gate G1 from a doped semiconductor of a conductivity type opposite to that of the charges stored thereon during programming. Since negative charges are stored on the floating gate, the semiconductor floating gate G1 should be p-doped.

As is the case for the application of the Fowler-Nordheim tunnel effect, there is generally also for the application of the gate surface effect an upper and a lower limit for the insulator thickness $x$ of the insulator Lx/x. In one example, the curve F2, F3 had approximately the same course as in FIG. 22. However, curve F1 has a different form and location than in FIG. 22. In addition, the course of curve F1 is dependent on the slope of the pulse leading edge of the extinction voltage and on the duration of the single pulses. For low values of x higher field strengths are needed than for higher values of $x$ (Cf. Journal of Electrochemical Society of Solid State Science and Technology, 119 (1972) 598, FIG. 3). The lower and upper limits, thus ascertained, as well as the optimum value of the insulator thickness, frequently do not differ too much from the values found for the Fowler-Nordheim tunnel effect, so that, likewise, about 600 A was ascertained as optimum thickness x in an n-channel memory FET example.

Because the floating gate G1 is programmed with the aid of electrons, as shown in FIG. 21, a potential must be applied to the charging gate G2 which is negative in comparison with the source S, or with the other parts of the main gap, in order to use the gate surface effect of the Fowler-Nordheim tunnel effect.

As described above, the amount of dissipated heat is particularly small if the stored electrons can flow off into the drain or the source in the presence of a floating substrate. However, even if a bias potential is applied to the substrate the losses produced in the main gap are small in comparison with the quenching during an avalanche breakdown condition or channel injection, as has been shown with reference to the upper limit for the insulator thickness $x$.

Special experiments have demonstrated that another discharge current of holes ($-Kd$) is frequently superposed in an opposite direction, at least momentarily, on the discharge current of electrons ($Kd$). The superposed current of holes ($-Kd$) has, in fact, a discharging effect on the floating gate G1, and it needs no strong current along the main gap to be generated. Thus, it is generated without dissipating an appreciable amount of heat in the main gap. Hence, the superposed current of holes is seldom mentioned explicitly herein, or in other treatises on the subject, to be a part of the current of electrons ($Kd$) drifting from the floating gate.

In Proceedings of the 3rd Conference on Solid State Devices, Tokyo 1971/Supplement OYO BUTURI 41 (1972), 159, particularly FIG. 8 and the accompanying description, there is disclosed a n-channel memory FET. A second paper by the same authors appeared at about the same time in the IEEE Journal of Solid State Circuit SC7, NO. 5, October 1972, pp. 369–375 with similar contents. The FET shown in FIG. 8 of the first disclosure has an electrically floating gate G1 completely surrounded by an insulator. If further has a controllable charging gate G2. The floating gate G1 is placed between the charging gate G2 and the main gap of the memory FET, such that the floating gate covers a first position only of the entire width of the channel viz. a portion of the channel adjacent to the source. The charging gate covers the remaining portion of the substrate connected in series electrically and adjacent to the drain, as well as the floating gate G1. The state of the channel is controlled in the vicinity of the source by both the state of the charging gate and that of the floating gate. However, the state of the channel in the vicinity of the drain is only controlled by the state of the charging gate.

There is no statement anywhere in the foregoing disclosures why an asymmetrical floating gate is used. However, in the first disclosure something is mentioned about the operating mode of the memory FET, e.g., with reference to FIG. 6. It should be noted that, apparently due to a misprint FIG. 8 has been referred to as FIG. 9. Hereinafter that figure will be referred to herein as FIG. 8.

According to the accompanying drawing in the aforementioned disclosure, the heating of electrons is to take place in a pinch-off region next to the source-side end of the depletion zone (see the gate-channel field strength arrows shown in FIG. 6). The depletion zone is produced in the drain-side regions in which the gate potential is negative with respect to the potential of said drain-side regions. Thus, along these regions there is applied a gate-channel negative anode potential that prevents said channel electrons from being ejected from the substrate surface and injected into the gate. Only in the pinch-off region is there no negative anode potential, but an accelerating voltage permitting the injection of the ejected electrons into the gate.

It has been demonstrated that on account of the required gate potentials a relatively rapid discharge of a heretofore positively charged floating gate can still be achieved through compensation of the stored holes with injected channel electrons. However, the floating gate can no longer be charged highly negatively in the case of the extinction voltages used in this case (See FIG. 5 of the second of the foregoing disclosures and accompanying description). The weak negative "charge" of the gate observed by chance after the first and third quenching was nothing but a side effect occurring in a narrow range, not usable for programming on account of its small amplitude. Special experiments with similar memory FETs, viz. FETs having identical channel lengths (i.e. 10 micrometers) (cf. second disclosure, page 370, right-hand column, first paragraph of chapter A) showed that in this case unusually high voltages would have to be applied so as to be able to use a reliable negative and adequate charge of the floating gate for programming.

Since both of the aforementioned disclosures have given no reason why they used an asymmetrical floating gate, one must resort to speculation. It seems to have been assumed that the heretofore positively programmed floating gate was discharged, not only by the electron injection of the pinch-off region, i.e., through compensation, but that the relatively high-speed channel electrons, particularly in the vicinity of the drain, i.e., in the vicinity of the p-n junction, generate hot holes and that such hot holes could likewise be injected into the floating gate. This could then slow down or even make impossible the discharging of the floating gate. It must have been for this reason the asymmetrical floating gate shown in FIG. 8 of the first disclosure, is used, namely, with the hope that no hot holes could be injected into the floating gate. However, from the second disclosure (FIG. 2 and accompanying description) it is quite clear that at this point in time the use of a symmetrical floating gate was deemed necessary only in order to achieve the desired quenching show in FIG. 5 of the reference.

In the case of the invention, an appropriate negative charge of the floating gate is necessary to produce the electrostatic induction inhibiting the drain to source current. Special experiments have shown that if the channels are short, e.g., 3.6 micrometers, a high negative charge of the floating gate can also be achieved by use of channel injection. With short channel lengths the field strength in the channel can be made of sufficient magnitude even without creating a depletion zone or a pinch-off region due to velocity saturation with relatively low voltages, so as to heat channel electrons therein so strongly that they are ejected from the channel, pass through the insulator and can charge the floating gate negatively. Thus, with this channel injection the potential of the floating gate can be so strongly positive with respect to the drain that neither a pinch-off region nor a depletion zone is created and, in contradistinction to the techniques described in other disclosures, the injection is even improved instead of made impossible.

The disclosures in the aforementioned references succeed only in achieving the quenching of the initially positively charged floating gate (FIG. 5 of the second reference). However, there is no negative charge of the floating gate of, e.g., −10V, as is provided by the invention. The latter is not a negligible side effect, but provides for the generation of the electrostatic induction inhibiting the drain to source current.

Figure 3:
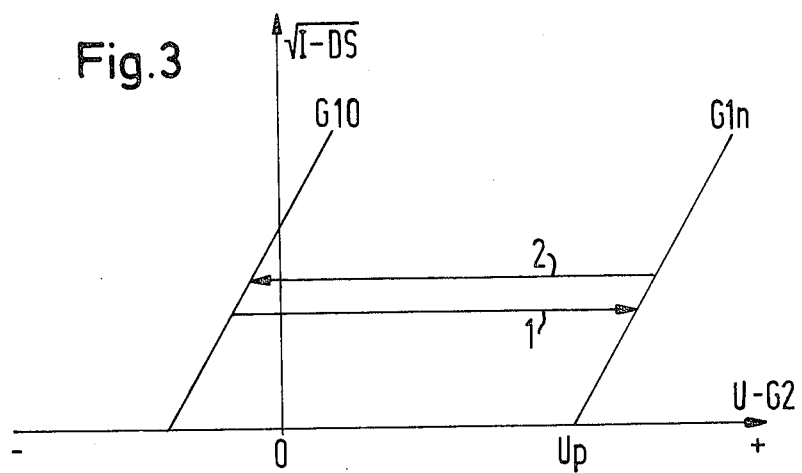
FIG. 3 is a current-voltage characteristic diagram of an embodiment of the FIG. 1 type which in the non-program mode is of the depletion type.

In Solid-State Electronics 12 (1969), pp. 981–987, FIG. 1, a MNOS memory FET having two gates is described. Between its charging gate G2 and the main gap, as shown in FIG. 3 therein, and provided with a n-channel there is disposed a second controllable intermediate gate covering only a portion of the channel adjacent to the source. The remaining portion of the channel adjacent to the drain as well as portions of the intermediate gate are covered by the charging gate. Thus, the structure is the same as in the case of the memory FET described in the other references discussed hereinabove, with the difference that in this case a MNOS memory FET without channel injection is involved, in which the intermediate gate is not floating but is controlled externally. However, when compared with memory FETs having an insulated floating gate, MNOS memory FETs have the drawback that as a result of charge decay they lose their programmed state after a relatively short period, i.e., the more rapidly, the more frequenctly the state is read. However, in the case of memory FETs having a floating gate the charge decay sets in much later and is, moreover, more independent of the number of read operations that have occurred in the meantime.

The invention provides a memory FET that is programmable with electrons, and the floating gate of which can be discharged via electrical means, e.g., using the avalanche breakdown at a high drain or source/substrate voltage, with the channel in the nonconducting state, or by means of other effects described hereinbelow. Likewise, a quartz window may be left out in the enclosing case surrounding the FET to make quenching possible by exposure to ultraviolet light. An inexpensive plastic case may also be employed.

The memory FET of this invention may also be characterized in that even in the case of excessive quenching, i.e., when the floating gate is positively charged with holes after quenching, the main gap of the memory FET (i.e., its source and drain region) charged with the read/drain to source voltage is nonconducting as long as its charging gate has no potential that is positive with respect to all channel portions controlled directly by it. That is, as long as, for example, a source potential is applied thereto. If a positive potential of sufficient magnitude is applied to the charging gate, then the main gap of the memory FET according to the invention charged with the read/drain to source voltage shall be conducting, if the memory FET is unprogrammed, i.e., is quenched or excessively quenched. The main gap charged with the same read/drain to source voltage shall, however, be nonconducting despite the positive potential across the charging gate, if the floating gate is programmed with electrons. If, however, a negative (i.e., with respect to at least one of said channel portions) potential or substantially the same potential is applied to the charging gate, the main gap charged with the read/drain to source voltage shall always be nonconducting or at least poorly conducting, regardless of whether the floating gate is quenched, excessively quenched or programmed.

The quenching relates to a particular memory FET with an asymmetrical floating gate, whereby the embodiment of the inventive memory FET is, particularly, differently operated as in previously known techniques. It is characterized in that the floating gate covers only a first portion of the channel extending over the entire width of the channel and containing the channel portion ejecting the hot electrons using channel injection during programming, or which at least is adjacent to these channel portions. The charging gate, but not the floating gate, covers the remaining part of the channel and is connected in series electrically so that the state of the first portion of the channel is controlled directly both by the state of the charging gate and by that of the floating gate. The state of the remaining portion of the channel is controlled directly by the state of the charging gate only.

Thus, in the case of the invention, the channel portion ejecting electrons by means of channel injection and lying, for example, close to the drain, is covered by the floating gate, or the channel portion covered by the floating gate is adjacent to this channel portion. Hence, the ejected hot electrons can charge the floating gate. The electrons ejected by channel injection serve above all for programming (i.e., charging) the floating gate, instead of for quenching (i.e., discharging) the same. In addition, provision is made that by charging the floating gate negatively, the main gap of the memory FET (i.e., the source and drain junction thereof) is driven into the nonconducting or excessively nonconducting state. Thus, as a result of the negative charging of the floating gate (e.g., in the case of an enhancement-type FET), even if the floating gate is excessively quenched (i.e., if it is charged positively with holes), no current flows to the charging gate in the main gap which is charged with the read/drain to source voltage if the source potential (e.g., ground potential) is applied. This effect is due to the fact that the remaining channel portion is nonconducting independently of the state of the first channel portion controlled by the floating gate. The same holds true for a depletion-type FET and a FET with barrier-type channel with properly changed potentials.

Figure 23:
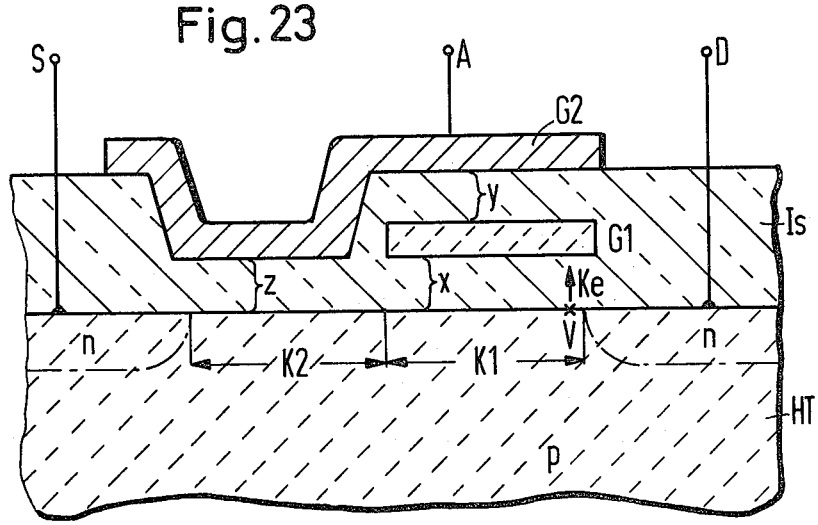
FIGS. 23 – 25 are partial cross-sectional and schematic views illustrating alternate forms of gate design.

The longitudinal section in FIG. 23 of an enhancement-type FET with a n-channel shows the floating gate G1 completely surrounded by an insulator Is and which, hence, is floating electrically. During programming, its floating gate G1 is charged negatively by the hot electrons Ke which are generated in the channel itself at channel site V. Hence, after the negative charging, particularly during reading, its floating gate G1 exert, through electrostatic induction an influence on the main gap S-D in a manner inhibiting the main gap current. The inhibiting effect will be stronger the smaller the distance.

In addition, the memory FET contains the controllable charging gate G2. In the example shown in FIG. 23, the floating gate G1 is placed between the charging gate G2 and the main gap D-S in such a manner that gate G1 covers only a first portion K1 adjacent to the drain. This covering extends over the full width of the channel. The channel portion K1 includes the channel site V which, during programming, ejects the hot electrons Ke, using channel injection. The remaining portion K2 of the channel is covered by the charging gate G2 but not by the floating gate G1; the remaining portion K2 borders on the source only.

The state of the first channel portion K1 is controlled both directly by the state of the floating gate and indirectly by the state of the charging gate capacitively coupled therewith. The capacitive coupling of the two gates is the stronger the smaller the distance ($y$) between them, and the larger the surface of the mutual overlap of said gates. The state of the remaining channel portion K2 is controlled directly by the state of the charging gate only, which exerts stronger control the smaller the distance ($z$) between the charging gate G2 and the remaining channel portion K2.

The mutual overlap of the gates may also be placed outside of the memory-FET intersecting plane shown in FIG. 23 instead of, as shown in FIG. 23, within the intersecting plane.

Thus, in the case of this embodiment of the memory FET constructed in accordance with the invention, the channel includes the two parts K1, K2, which are connected in series electrically. Hence, if the memory FET is not charged over its charging gate terminal A with a potential intended for reading and clearly positive with respect to the source potential, i.e., if, for example, the source potential is applied concurrently to terminal A of the charging gate, the remaining channel portion K2 is in its nonconducting state. Then, regardless of the condition of the first channel portion K1, the remaining channel portion K2 and, therewith, the main gap S-D are nonconducting. Thus, no main gap current flows as read data, regardless of the state of the floating gate. This occurs, regardless of whether the floating gate is charged with electrons or is discharged or is quenched excessively, i.e., charged with holes. Hence, even excessive quenching, as a result of which the first channel portion K1 is driven into the conducting state, cannot in the case of the invention cause the read voltage between charging gate and channel to yield false read data.

If a read potential which is sufficiently positive with respect to the source potential is applied to terminal A of the charging gate, the whole remaining channel portion K2 is driven into the conducting state, regardless of the program mode of the floating gate G1. At the same time, the first channel portion K1 will be conducting or nonconducting owing to the capacitive coupling of both gates and regardless of the program mode of the floating gate G1. It is nonconducting if the floating gate G1 is programmed by means of electrons, but is conducting if the floating gate G1 is at least substantially in the discharged or even excessively discharged (i.e., positively charged) condition.

Hence, if the floating gate G1, after quenching, is not fully charged but instead is excessively discharged and, as a result, is positively charged, dependable reading is nevertheless possible in the case of the illustrative embodiment of the invention. The main gap S-D in FIG. 23 in this case is conducting if a positive read potential is applied to terminal A and because the main gap S-D is nonconducting regardless of whether the floating gate is fully or excessively discharged in the presence of potentials corresponding to the non-read command and negative with respect to the read potential.

Moreover, the dependable reading described above is also possible in the case of a memory cell having only a single memory FET, constructed according to the invention, and one that contains a multiplicity of memory FET cells, also constructed according to the invention. In the case of the operating mode described above, reliable reading is obtained even without connecting in series a separate memory FET in each cell, in addition to the memory FET concerned, that is to say, even if excessive quenching is allowed (FIG. 4). In the case of the invention, very little space is needed for each memory cell and it is possible to economize on the parts required for each memory cell, with very modest requirements with respect to the tolerances of the quenching operations controllable by electrical means. The low tolerances are particularly evidenced by the fact that excessive quenching is allowed in the invention.

Figure 24:
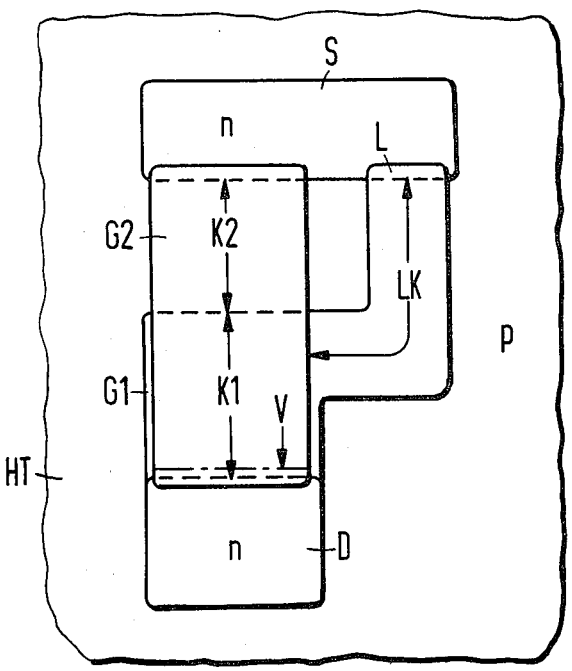

The channel injection can be brought about by generation of hot electrons in the channel in the vicinity of the drain, as described above (cf. channel location V shown in FIG. 24). To achieve this, a potential may be applied to the charging gate via terminal A and to the main gap D-S of such magnitude that a velocity saturation of the channel electrons is produced long enough until the desired complete programming of floating gate G1 is achieved.

However, it is also possible (FIG. 25) to place an acceleration space V within the channel, e.g., in the vicinity of the drain, the acceleration space in this case being constituted by a narrowing V in the channel. Instead of such a narrowing V, or even in addition thereto, the acceleration space may also be formed by another kind of inhomogeneity of the channel in the same location in the channel, e.g., by a large thickening of the insulator between floating gate and channel at channel location V.

The memory FET constructed according to the invention cannot only be programmed via electrical means, but can also be quenched by electrical means. For example, quenching can occur by using the avalanche breakdown, if the first channel portion K1 covered by the floating gate G1 is adjacent to the p-n junction between the channel on the one side and the drain or source on the other. In this case the p-n junction in its nonconducting state is charged for breakdown, so that hot holes pass from the p-n junction through the insulator to the floating gate. These holes that are injected into the floating gate G1 compensate the negative charge present thereon, resulting in the quenching caused by electrical means. As noted earlier, overcompensation of the negative charge of the floating gate is allowable without impairing the operation of the memory FET constructed according to the invention. Since overcompensation is harmless, the permissible variations for the extinction voltage in the invention may be correspondingly large. In addition, the discharges of the floating gate G1 can be accelerated, i.e., carried out within very short periods, specifically through the application of high extinction voltages. In addition, the memory FET can also be quenched by the other methods known in the prior art, e.g., by illumination with ultraviolet light or exposure to X-rays.

However, the quenching may also be carried out using the Fowler-Nordheim tunnel effect or the gate surface effect.

The electrons may leak off into the first channel portion K1, if the latter is designed as a depletion channel and, hence, is n-doped, or also into source S or drain D, i.e., into n-doped regions. For that, the extinction voltage must be applied between the terminals A on the one side and S or D on the other, and the potential of the other region D or S or that of the substrate HT may also float if no depletion channel is present. In this case, the definition of drain and source corresponds to the direction of current in the main gap during programming or during reading. This use of an effect accelerating electrons from the floating gate G1 toward the main gap has the additional advantage that the extinction voltage, which must be applied between terminal A and the main gap can often be distinctly smaller than if the avalanche breakdown is utilized for quenching, as described above with reference to FIG. 22.

In an illustrative embodiment of the memory FET constructed according to the invention, provision is made that the discharging of the floating gate can also occur in the direction of the source S if a remaining channel portion K2 is located between the source and the first channel portion K1. To do this, provision is made that the floating gate G1 (see FIG. 24) has an extended portion L covering parts of the source S away from the channel. Between portion L and source S is a thin-oxide layer. The discharge of the floating gate G1 occurs over the ohmic contact LK between portion L and floating gate G1.

To achieve this, three different effects may be applied either separately or simultaneously:

1. In the region of the portion L the p-n junction between source and substrate HT may be driven into the avalanche breakdown, causing the holes to flow from the avalanching p-n junction to floating gate G1 over portion L, if at the same time a negative (with respect to the source terminal) potential of sufficient magnitude is connected to charging gate G2, which is capacitively connected to the floating gate G1.

2. The Fowler-Nordheim tunnel effect and/or

3. The gate surface effect, which may also be applied between portion L and source S to quench floating gate G1.

To accomplish the latter alternative, one must apply between charging gate G2 and, hence, floating gate G1, on the one side and source S on the other, a voltage of sufficient magnitude that accelerates the electrons of floating gate G1 over portion L into the insulator between it and source S. The relations shown in FIG. 22 between the insulator layer thickness $x$ between portion L and source S hold true for the required voltage. At the same time, the potential of the drain or the potential of the substrate HT may float, so that no electrons can leak off into said two regions from floating gate G1.

The connection LK between portion L and floating gate G1 should be separated from the substrate HT by a thick-oxide layer having a thickness of, e.g., 10,000 A. This ensures that on the surface of the substrate HT in the region of the connection LK no conductive channel can be created between source S and channel portion K1, should floating gate G1, through excessive discharge be charged positively with holes. Thus, the installation of portion L and electric connection KL between the former and floating gate G1 has the advantage that a discharge of the heretofore negatively charged floating gate towards source S is possible with very little dissipated heat. Even with small extinction voltage amplitudes V, because the programming occurs on the channel location F, i.e., quite remote from the site where the discharge of the floating gate takes place, there is little contamination of the insulator by charges adhering thereto.

Figure 25:
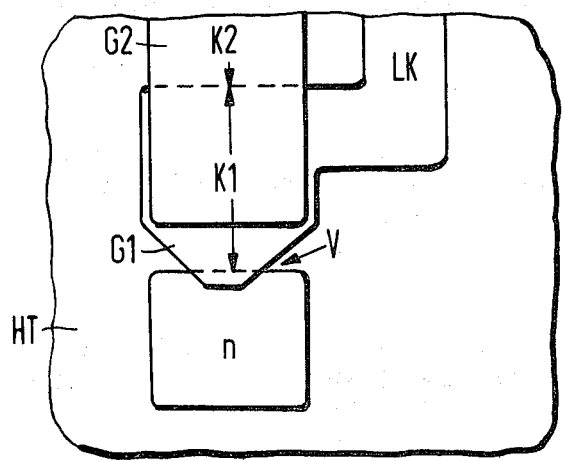

FIG. 25 also shows the connection KL seen in FIG. 24. The illustrative embodiment of FIG. 25 differs from that of FIG. 24 in two respects:

1. with respect to the structure of the channel site V producing the channel injection, viz. by a strong constriction, i.e., an inhomogeneity, as acceleration space;

2. with respect to charging gate G2 which, in this case, covers only a portion of floating gate G1 in the region of the first channel portion K.

It has been demonstrated that, at any rate, with small layer thicknesses ($y$) between floating gate G1 and charging gate G2, frequently a relatively small mutual overlapping of the floating gate, as shown in FIG. 25, is sufficient. In this case, the overlap is smaller than would be possible geometrically, for in such illustrative examples with partial overlap it is possible to achieve a capacitive coupling between floating gate G1 and charging gate G2 which coupling is sufficiently great to influence capacitively the potential of floating gate G1 over the potential of charging gate G2 and, thereby, the line condition of channel portion K1.

If the first channel portion K1 is adjacent to drain D, the channel injection can also be produced through control of a channel with no inhomogeneity as noted earlier by sufficiently high voltages between drain and source, particularly at appropriately high positive accelerating potential across terminal A to accelerate the channel electrons toward the floating gate.

If, instead, the first channel portion K1 is adjacent to the source S, the programming can occur by means of a channel injection caused by an inhomogeneity. A capacitive charging of lines connected to the drain can then conveniently be avoided if the first channel portion K1 is conductive due to excessive quenching, as long as the remaining channel portion K2 is conductive. A conductive first channel portion K adjacent to the drain causes a certain capacitive connection of the line connected to drain D and to terminal A over the capacitance produced by the floating gate G1/charging gate G2 and the conductive first channel portion K1. Furthermore, a very small insulator thickness $x$ between charging gate and channel is permissible in this further development, because no lower limit need be observed for the operation provided therein corresponding to the above described intersection point of curve F1 and curve F3 in FIG. 22, which is valid if the first channel portion K1 is adjacent to the drain. Due to the very small insulator thickness $x$, this further development can be operated at very low voltages.

If the first channel portion K1 is neither adjacent to source S nor to drain D, that is, if a section of the remaining channel portion K2 comprising two sections lies both between drain D and the first channel portion K1 and between source S and the first channel portion K1, then in the case of a conductive first channel portion K1 a capacitive connection of the source S, as well as a capacitive connection of the drain D to the terminal A is avoided. The intrinsic capacitance between portion L serving for the quenching and the associated H terminal (in this case to source C) is small in relation to said connections and, thus, largely negligible. In addition, this further development, too, has the advantage that a particularly small insulator thickness $x$ and, hence, very low working voltages are permissible, because the lower limit shown in FIG. 22 in this case need not be adhered to either, since the first channel portion K1 is not adjacent to the drain.

If the remaining channel portion K2, or at least a section thereof, is placed between drain D and first channel portion K, the main gap, despite the conductive channel portion K1, can conduct low-resistance currents only if a more positive potential is applied to charging gate G2 than to drain D.

Portion L may also cover in the further development two sections of the residual channel portion, e.g., parts of the drain instead of parts of the source, as a result of which quenching can be brought about by applying the extinction voltages in the direction of drain D instead of in the direction of source S.

The invention has been described primarily with reference to structural examples of the enhancement type. However, the teachings in accordance with the invention may also be applied to memory FETs with a depletion-type channel and with a barrier-type channel.

As noted earlier, a discharging hole current is frequently superimposed on the discharging electron current, whereby the discharging hole current likewise discharges the floating gate, due to its opposite current direction. To simplify the description, only the discharging electron current will be mentioned hereinafter.

The electric quenching and electric programming can advantageously be achieved with appropriate voltage amplitudes within a short period, e.g., within approximately 10 ms, e.g., with about 35-V voltage pulses between floating gate and source with the first quenching and within one minute, e.g., with the twentieth quenching. Thus, the measured quantities vary. The technical effort required therefore is very small.

The use of a n-channel instead of a p-channel for the memory FET is necessary, since otherwise no programming by means of channel injection and subsequent quenching by means of the above effects is possible.

The teaching described hereinbelow makes it possible to quench a single memory cell separately without at the same time having to quench other memory cells of the storage, e.g., other storage cells of the same memory row. Thus, bit-by-bit quenching can be performed from the multiplicity of bit quantities stored as a unit in the memory matrix. Moreover, the teaching frequently permits the simultaneous quenching of still other memory FETs of the memory matrix, more particularly of the same memory row by applying the appropriate voltages to the selected memory cells.

This feature of the invention uses a n-channel memory FET having a one-terminal charging gate and a floating gate completely surrounded by an insulator. The floating gate, during programming, is charged negatively by hot electrons generated in the FET channel using channel injection. The floating gate, after charging, particularly during reading, acts on the source and drain junction (i.e., the main gap) in a manner inhibiting the drain-source current. Such memory FETs are multiply provided in a storage matrix and embodied in the integrated circuit on a substrate, and each one of them forms a memory cell. The charged (i.e., programmed) floating gate is discharged by electrical means, i.e., by means of an extinction voltage applied between the charging gate and the main gap by an effect that causes electrons stored in the floating gate and accelerated by the extinction voltage in a direction away from the floating gate into the insulator between the floating gate and the main gap to be transferred across the insulator to the main gap, i.e., to the channel or drain or source.

The extinction voltage of corresponding polarity is applied between the charging gate and the region of the main gap toward which the discharge is to take place. The charging gates of the storage cells arranged in the first matrix dimension are each connected by a first control lead.

The advantages of this feature of the invention are made possible because the second terminals of the 2-terminal main gaps of the memory cells arranged in the second matrix dimension are each connected by a second control lead, because the second control leads are not interconnected permanently conductively and because during the quenching of a memory cell the extinction voltage is applied between the first control lead connected to the associated charging gate and the second control lead connected to the associated second terminal.

Thus, in contrast to the memories shown in FIG. 4, the second control leads are not interconnected permanently conductively through a common terminal So. Due to the usually existing electrical isolation of the two control leads it is possible to apply the extinction voltage via such an isolated second control lead and via a first control lead of the storage cell located at the crossing of the two control leads in such a manner that only the unit of information in the memory cell is erased bit-by-bit. The units of information in other memory cells connected to the same first control lead are not erased simultaneously. Thus, the invention represents a special advantageous development of the activation of the n-channel memory FET.

Figure 26:
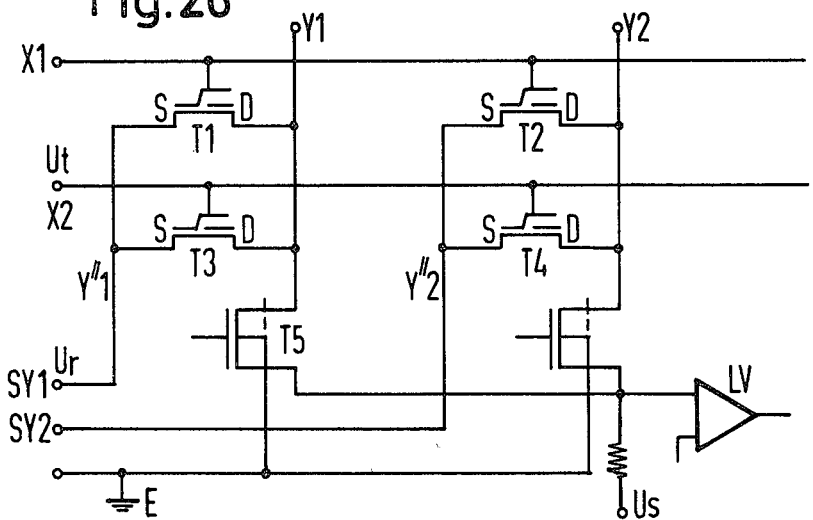
FIGS. 26 and 29 are schematic diagrams providing examples for the arrangement of control leads and their operating states in matrices formed by memory FETs constructed according to the invention.
Figure 27:
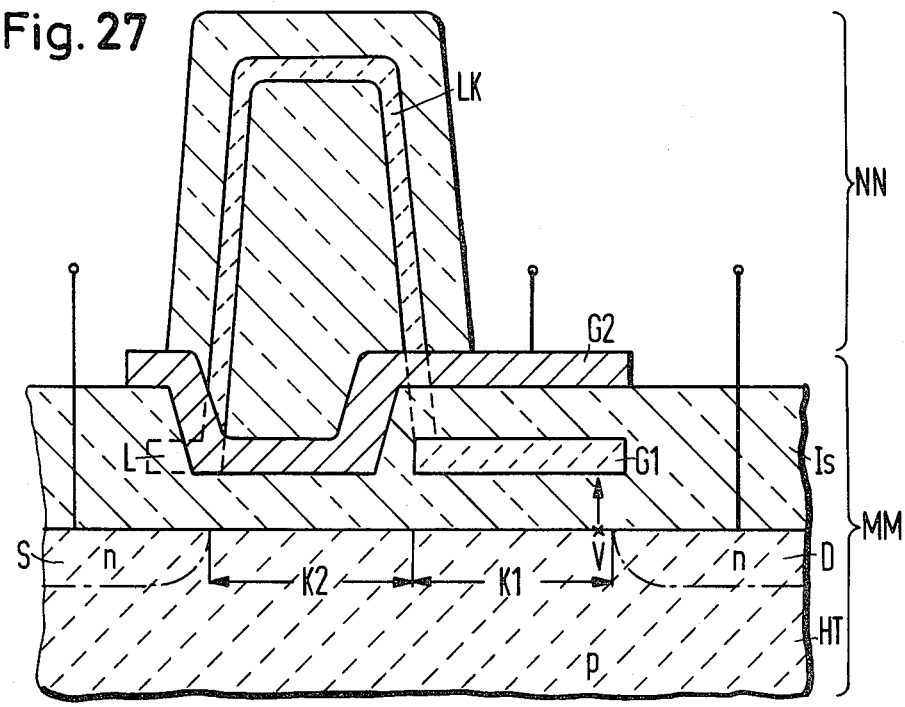
FIGS. 27, 28, and 30 are partial cross-section and schematic views illustrating alternate forms of construction for electric low-impurity quenching of memory FETs according to the invention.

FIG. 26 shows n-channel memory FETs T1 to T4. The two-dimensional storage matrix may likewise comprise many more than just four such memory FETs. Each of the single memory FETs contains, in addition to a controllable charging gate, an electrically floating gate completely surrounded by an insulator. Reference should be made, for example, to FIG. 27, where the floating gate G1 during programming is charged negatively by hot electrons (Ke) generated in its own channel (at a channel location V) using channel injection. After this negative charging, the floating gate (G1), especially during reading, acts on the main gap (i.e., on its portion K1) through its negative charge and by electrostatic induction in a manner inhibiting the drain to source current. Thus, after programming, the main gap (K1/K2) is driven into an excessively nonconducting state.

The charge (i.e., programmed) floating gate (G1) can be discharged by electrical means, that is, using an extinction voltage applied between the charging gate and the main gap by an effect that causes electrons stored in the floating gate to be transferred across the insulator (Is) to the main gap. The above described discharging hole current may be superimposed on the discharging electron current on the same location of the insulator. To accomplish this, the proper extinction voltage with corresponding amplitude and polarity is applied between the charging gate and the region of the main gap (i.e., between the charging gate and the drain or source or channel) toward which the discharging is to take place. In the example illustrated in FIG. 26, the discharging shall be performed in the direction of source S, i.e., toward the second control leads Y" 1 and 2. See, for example, the memory cell T1 and the associated second control lead Y"1 illustrated in FIG. 26.

The single memory FETs, embodied in the integrated circuit, are arranged into a storage matrix, each one of them forming a separate memory cell. The floating gates of the storage cells arranged in the first matrix dimension are interconnected by first control leads (cf. X1, X2 in FIG. 26). The control lines X represent the horizontal lines of the memory. The second terminals (S) of the two-terminal main gaps of the memory cells arranged in the second matrix dimension are interconnected by a second control lead Y"1, Y"2, whereby the second control lines Y" are not conductively interconnected.

This is a first feature by which the structure of this development of the invention shown in FIG. 26 differs from the arrangement shown in FIG. 4. In this embodiment the common terminal So of FIG. 4 is not provided. Instead, there are provided the corresponding terminals SY1 and SY2, which are separated from each other and which, at any rate, are not interconnected.

According to another feature of this embodiment of the invention, the quenching is performed by applying the voltage U$r$1/U$t$1 (e.g., U$r$1 = +35V, U$t$1 = 0V) to the selected memory cell (e.g., T3) via the associated first control lead (X2) and via the associated second control lead (Y"1) (FIG. 26). In this case, the negative charge stored from the insulated floating gate of memory cell T3 is discharged via source S of said storage cell T3 toward terminal SY1, whereby, for example, +20V may be applied to the remaining first control leads, and 0V to the remaining second control leads so as to avoid interferences, i.e., quenchings and programmings of the non-selected storage cells T1, T2 and T4. To avoid main gap currents, the potential of the drain terminals D or Y$_1$, Y$_2$ may float concurrently.

However, by means of switches not shown in FIG. 26, a conductive connection may temporarily be established between terminals SY1, SY2 and, hence, a conductive connection of second control leads, e.g., in order to simultaneously quench several memory cells of a given row of the memory. If the terminals SY1, SY2 are conductively interconnected, the proper extinction voltage is applied not only to the memory FET of the memory cell T3 but also simultaneously to other memory FETs located in the same row, in this case to memory cell T4. At the same time, the two memory FETs T3 and T4 are quenched via their source S.

However, in the invention the electrical isolation normally existing between the second control leads Y" makes it possible to erase units of information in the memory bit-by-bit, instead of erasing simultaneously, e.g., gross information held in several memory cells word-by-word, and to have to write the new word into all the quenched cells. Thus, the invention also reduces the number of cell quenchings which, due to the often limited number of possible quenchings and reprogrammings of a cell without contamination or destruction of the insulator, generally leads to a prolongation of the trouble-free life of the memory.

In particular, the superimposed discharging hole current component, if sufficiently large, can obviously produce local chargings of the insulator at the site of discharge (i.e., the charged traps in the insulator), whereby the insulator at the site across which the discharging of the floating gate G1 takes place becomes increasingly contaminated from discharge to discharge. As noted earlier, owing to this contamination, the discharge period increases with each new discharge until finally it becomes so long (e.g., several minutes) that further quenchings must be considered as disturbed and, thus, cannot be carried out.

Similar variations of the periods necessary for the programming, or of the programming voltages necessary for constant periods, are frequently observed if the insulator is contaminated near the site in the insulator across which a charge is placed on the floating gate.

In order to increase the number of quenchings and reprogrammings that can be performed without heavier contamination, i.e., without fault, the above-mentioned teaching can likewise be applied to this case, namely, be performing the programming of the uncharged floating gate (K$e$ in FIG. 27) as far away as possible from the site in the insulator of the memory FET across which the quenching of the floating gate takes place. Fewer variations of the quenching and programming periods will then be observed. Since in the structure shown in FIG. 26 the quenching of the floating gate shall be performed toward the source S, in order to avoid contamination of the insulator Is that insulates the floating gate, caused, as described above, e.g., by traps, the programming shall be performed as far away as possible from source S. Hence, in this case, it is of advantage to place the channel location emitting the electrons K$e$ as far away as possible from source S.

Figure 28:
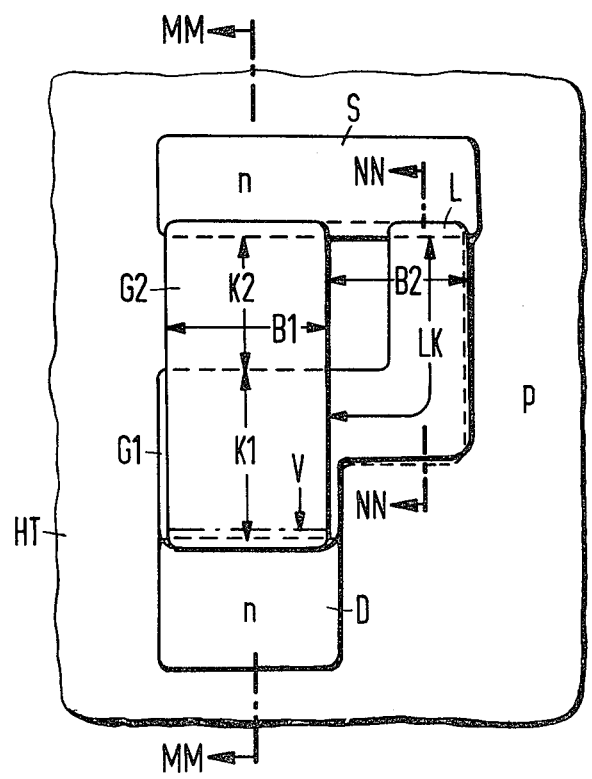

FIGS. 27 and 28 show a structure in which the floating gate of the n-channel memory FET covers only a first part K1 of the channel extending over the entire width of the channel. The covered part includes the channel location V emitting the hot electrons K$e$ during programming by means of channel injection. It suffices however, if this first channel portion K1 be at least contiguous to the channel location V. In this special memory FET, provision is also made that the charging gate G1, but not the floating gate G2, covers the remaining portion K2 of the channel lying in series electrically, so that the state of the first portion K1 of the channel is controlled directly both by the state of the charging gate and by the state of the floating gate. But, the state of the remaining portion K2 of the channel is controlled directly by the state of the charging gate alone.

The memory FET can be so designed that despite the distance between source S and first channel portion K1 the quenching of the floating gate G1 can occur toward source S.

FIGS. 27 and 28 illustrate a preferred embodiment in which FIG. 27 is partially a cross-sectional view taken in the plane MM and partially a cross-sectional view taken in the plane NN. In this structure, the quenching of the floating gate G1 takes place via an arm LK which is conductively connected to the floating gate G1 and placed laterally of channel K1/K2 (FIG. 28) over an overlap L conductively connected thereto, toward source S, which is separated therefrom by a thin, e.g., 600-A thick insulator Is. The arm LK, in turn, is separated from the substrate HT by a very thick, e.g., 10,000-A insulative layer, so that the negative charge still cannot produce a conductive channel under the arm LK in the p-doped substrate HT that would span K2 (FIG. 28).

As shown in FIGS. 27 and 28, the charging gate G2 in the channel portion K2, which is different from the first channel portion L1, may only be separated from the substrate HT by a thin-oxide layer having a thickness of, e.g., 600 A. In this case, the charging gate G2 produces only with its width B1 the charges flowing in the channel. Due to the relatively high conductivity of the layer forming the arm LK, the potential of the latter becomes largely identical with that of the floating gate G1 in the region of the first channel portion L. Thus, the potential of arm LK is only indirectly affected by the charging gate G2.

To increase this interference, the capacitance between the charging gate G2 and the arm LK and the floating gate G1 can be enhanced in the manner shown in FIG. 28. That is, this capacitance can be made more effective by covering, not only the floating gate G1, but also the arm LK by the extension B2 of the charging gate G2. Thus, the charging gate G2 is insulated from arm LK only by a thin-oxide layer, which is not shown in FIG. 28 in the interest of clarity. Thus, the charging gate G2 is primarily separated from the substrate HT by a thick-oxide layer so that neither the charging gate G2 nor the floating gate G1 can produce a conductive channel in the substrate HT. By this increase of the capacitance between the charging gate G2 and the arm LK and the floating gate G1 a lower voltage between the charging gate G2 and the source S during the quenching can be used than if the capacitance is not increased. By lowering this voltage, the tolerances for the dimensioning of the generators supplying this voltage and for the switches thereof can be increased considerably, thereby improving the operational reliability of the memory.

The first terminals (i.e., the drains D) of the main gaps of the memory cells arranged in the second matrix dimension may, in addition, be interconnected by third control leads (Y1, Y2). These control leads Y may be utilized to good advantage both for programming and for reading, as will be described below.

During the programming of a memory cell (e.g., T3), a programming potential U$t2$ may be applied to a first control lead (X2) allocated to the memory cell (FIG. 26). The programming potential U$t2$ accelerates the free electrons generated in the channel, by channel injection, causing them to drift toward the floating gate. To ensure that the channel site V delivers, by channel injection, the free electrons K$e$ charging the floating gate G1, a programming voltage (U$r2$/U$s2$) must be applied to the main gap of the memory FET (T3) by second and third control leads Y"1/Y1, e.g., by applying the programming voltage U$r2$/U$s2$ between the second control lead Y"1 and the third control lead Y1 by a switch T5 (FIG. 26).

It has been shown that the memory FETs constructed in accordance with the invention can also be read via the third control leads Y without considerable constructional effort, because during the reading of a selected memory cell (e.g., T3 in FIG. 26) a read potential U$t3$ can be applied to the first control lead allocated to the memory cell. The read potential drives the main gap of the memory cell (T3) into the conducting state, if the memory cell T3 is not programmed, and it drives the main gap, i.e., in this case the first portion K1 of the memory array of FIG. 27, into the nonconducting state, if the memory cell T3 is programmed. Whether the main gap of the memory cell is conducting or nonconducting is determined by a simultaneous application of a read potential, e.g., U$r3$/U$s3$, via the associated second control lead Y"1 and associated third control lead Y1. Thus, in this case during the reading of a memory cell, a read potential U$t3$ is applied to the first control lead X2 allocated to the memory cell T3, and an additional read potential U$r3$/U$s3$ is applied between the second and the third control lead Y"1/Y1. The current monitored in an output amplifier LV and flowing through the main gap K1/K2 and, hence, through the second and third control lead Y"1/Y1, is dependent on whether the memory cell T3 is programmed or not programmed.

The memory FET of FIG. 27 having two separate differently controlled channel portions K1 and K2 and lying in series electrically has the additional advantage described above that during the quenching it may also be excessively discharged. Thus, the floating gate G1 is not discharged, but positively charged. The arrangement of such memory FETs into a memory matrix (FIG. 26) also has the advantage that quenching, due to the admissibility of excessive quenchings, can be carried out easily and very rapidly in the case of high tolerance values for the extinction voltage and extinction potential and for the period during which said extinction voltages and extinction potentials can be applied to the individual memory cells. This memory array thus has great operational reliability.

As described above, the contamination of the insulator is undesirable, primarily because as a result the quenching period is considerably increased from quenching to quenching, so that finally the quenching is fully disturbed. It has been shown that this contamination during quenching can almost fully be avoided so that the quenching periods are only slightly increased, thereby increasing considerably the number of trouble-free quenchings and prolonging the life of the memory FET accordingly. To achieve this, it is of advantage to bring about the discharge by means of extinction voltages U$r1$/U$t1$ which rises slowly and linearly without interruption, e.g., within three seconds from 0V to their final values, e.g., 35V, between main gap and charging gate G2. One may also use an appropriate amplitude-modulated train of positive pulses for quenching, the amplitude of which the envelope curve rises slowly and uninterruptedly.

Due to this slowly rising extinction voltage, instead of one that is high from the outset, the discharging of floating gate G1 occurs very slowly, i.e., exactly at the lowest possible extinction value (see F1 in FIG. 22). In this case, the discharging occurs only as a result of the Fowler-Nordheim tunnel effect, whereby the voltage applied between floating gate G1 and the main gap is too low to allow a discharging hole current, which is superimposed, to flow simultaneously as a result of avalanche breakdown. See the minimum voltage shown in curve F2 of FIG. 22 required for generating a discharging hole current, which is no longer attained here. Thus, the discharging hole current is not present and the traps in the insulator are not occupied by holes. During the slow rise of the charging gate/main gap extinction voltage, the discharging electron current flows gradually, whereby the voltage between floating gate G1 and main gap does not exceed substantially the magnitude corresponding to curve F1. Hence, the rise of the extinction voltage U$r$/U$t$ must occur so slowly that there is no discharging hole current and the quenching period remains constant. Since contamination is avoided during quenching, no more substantial rise of the relevant quenching period is observed despite relatively frequent quenchings and reprogrammings. The maximum value for the velocity rise of the extinction voltage can also be ascertained by a test on a prototype for the structure of the memory FET selected in each case.

Because contamination is avoided, quenching may also be allowed to take place on the same spot in the insulator across which programming occurred. Thus, an account of this special quenching method one may also allow the floating gate to be programmed and quenched bit-by-bit near the drain without excessively increasing the quenching period. Hence, in this case no arm LK and extended portion L need be installed near the source (FIGS. 27 and 28) in a memory FET, the floating gate of which covers only the first channel portion but not the remaining portion of the channel. However, it is advantageous to place arm LK and portion L near the drain, if the first channel portion K1 is separated from the drain by a small section of the remaining portion K2.

The quenching method described herein may also be applied elsewhere beyond the example of FIG. 26, as will be described below.

In accordance with this aspect of the invention the extinction voltage is permitted to rise slowly to its final value, and this solves the problem of greatly reducing the increase in the quenching period. Otherwise, it must be observed from quenching to quenching, even in memory FETs that do not form the matrix of FIG. 26. Since the quenching periods in this case rise considerably more slowly, if at all, the number of quenchings and reprogrammings that can be performed without interference can be increased considerably with the aid of this feature of the invention. Hence, the life of the memory FET is also prolonged by the invention, because the quenching periods no longer reach unduly high values so rapidly.

Therefore, this embodiment of the invention is a memory FET, e.g., having a n-channel and having a one terminal controllable charging gate and a floating gate completely surrounded by an insulator. The floating gate is charged negatively during programming by means of hot electrons generated in its own channel using, e.g., channel injection. After the charging, its floating gate, particularly during reading, acts on the source and drain region, i.e., main gap, in a manner inhibiting the drain to source current by means of its negative charge through electrostatic induction. The charged, i.e., programmed, floating gate is discharged by electrical means, that is, by means of an extinction voltage applied between charging gate and main gap through the Fowler-Nordheim tunnel effect. The latter effect causes electrons stored in the floating gate and accelerated by the extinction voltage in a direction away from the floating gate into the insulator between floating gate and main gap to flow off across the insulator to the main gap, i.e., to the channel or drain or source. An extinction voltage of corresponding polarity is applied between charging gate and the region of the main gap toward which the discharging shall take place.

This embodiment of the memory FET is characterized in that during quenching the extinction voltage applied between charging gate and main gap rises slowly, e.g., within a few seconds, to its final value. The extinction voltage may, e.g., be serrated or pulsative in shape with a very flat ascending leading edge and constant pulse top corresponding to the final value. Alternatively, it may also be formed by an amplitude-modulated pulse train with slowly rising amplitude. The improvements achieved thereby during quenching, i.e., the fairly great freedom from interferences, and further developments of the invention will likewise be described with reference to the structural examples shown in FIGS. 29 and 30.

Figure 29:
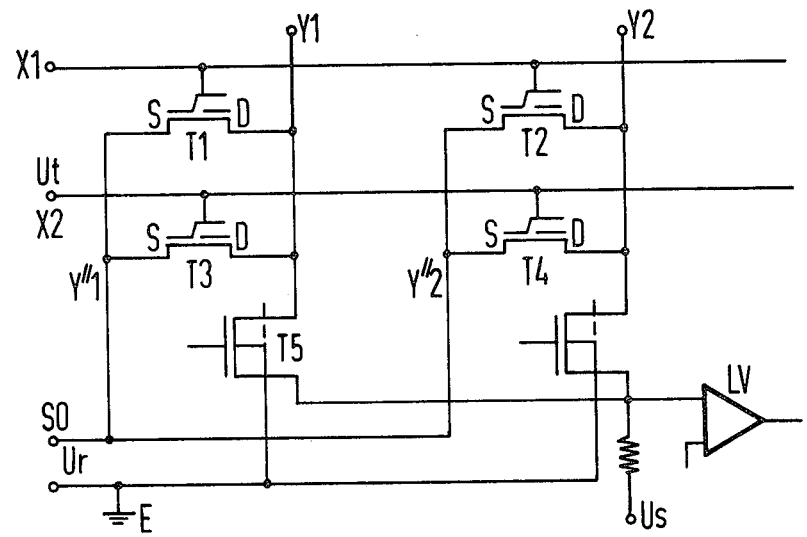

In FIG. 29 are illustrated n-channel memory FETs T1 to T4. The 2-dimensional memory matrix may, likewise, comprise many more than just four such memory FETs. Each single memory FET comprises, in addition to a controllable charging gate, an electrically floating gate completely surrounded by an insulator. See, e.g., floating gate G1 in FIG. 30. During programming, the floating gate is charged negatively by electrons (Ke) which are generated, i.e., heated, in the FET channel, at channel site V, using channel injection. After the negative charging, the floating gate (G1), particularly during reading, acts on the main gap, in this case on the first portion K1 thereof, in a manner inhibiting the drain to source current, by means of its negative charge, through electrostatic induction. Thus, after programming, the main gap (K1/K2) is driven into an excessively nonconducting state.

The charged, i.e., programmed, floating gate (G1) can be discharged by electrical means, i.e., using an extinction voltage applied between charging gate and main gap through the Fowler-Nordheim tunnel effect. This causes electrons stored in the floating gate to be transferred across the insulator (Is) to the main gap. During quenching, a discharging hole current may be superimposed on the discharging electron current at the same site on the insulator. The holes flow in a direction opposite to that of the electrons, so that the discharging hole current, likewise, acts on the floating gate G1, causing it to discharge.

This feature of the invention uses the finding that the discharging hole current is generated substantially by means of the avalanche effect superimposed on the Fowler-Nordheim tunnel effect. This avalanche effect was described with reference to curve F2 of FIG. 22. It has been shown that the quenching period, which increases considerably from quenching to quenching, is primarily related to the appearance of the discharging hole current, because the traps naturally present in the insulator Is are occupied by holes that cause a contamination of the insulator. These holes that adhere to the insulator cause an increase in the minimum extinction voltages necessary for quenching and in the quenching periods necessary for the quenching.

It has been demonstrated that the increase in the quenching periods, which otherwise would lead to complete contamination and complete disturbance of the quenchings, can be fully avoided, or at least to large extent, if, during quenching, the extinction voltage (cf. Ur/Ur in FIG. 29 applied between charging gate G2 and main gap of the memory FET T3) is allowed to increase only slowly to its final value. The extinction voltage shall rise linearly and uninterruptedly, e.g., within 3 seconds, from zero voltage to its final value of e.g., +35 V between the main gap and charging gate G2. To achieve this, constant ground potential may be chosen for potential U1, and a rising potential which is positive with respect thereto may be selected for potential Ur. An appropriate amplitude-modulated train of positive pulses may be used for quenching; the amplitude of the pulses should rise equally slowly, increasing linearly and uninterruptedly. In this case, it is an amplitude-modulated pulse train, whereby the envelope curve of the amplitude rises slowly, increasing linearly and uninterruptedly to the final value at which the floating gate is quenched. The final value of the sawtooth voltage may thereafter still persist steadily for some time, so as to continue the discharging during this period also.

Due to this slowly rising extinction voltage, instead of an extinction voltage that is high from the outset, the floating gate G1 is gradually discharged as soon as the voltage F1 between floating gate and main gap, i.e., drain or source, is reached. Due to the discharge of the floating gate now being initiated, this voltage tends to become lower. However, since the charging gate/main gap extinction voltage continues to rise, the voltage between floating gate and main gap is further equal to the minimum voltage F1 that can be attained for the Fowler-Nordheim tunnel effect or only slightly higher (cf. F1 in FIG. 22), particularly with optimum dimensioning of the thickness $x$ of the insulator. The discharge occurs only as a result of the Fowler-Nordheim tunnel effect, because the voltage which is effective between floating gate G1 and main gap and remains substantially constant despite the slow increase in the charging gate/main gap voltage. This is due to the small magnitude of the discharging electron current, which is lower than F2, so that no superimposed discharging hole current resulting from the avalanche breakdown can flow simultaneously. Compare with the high minimum voltage F2 in FIG. 22 required for generating a discharging hole current, which can no longer be attained in the invention, as long as the thickness $x$ of the insulator Is does not exceed unusually large values (cf. 1100 A in FIG. 22). Thus, due to this teaching in accordance with the invention, the discharging hole current superimposed by the avalanche breakdown is avoided. Instead, only the Fowler-Nordheim tunnel effect appears, due to the slow rise of the extinction voltage as suggested by the invention, which causes the floating gate G1 to discharge gradually at relatively low voltages.

Since the discharging hole current is avoided in the invention, such holes no longer occupy the traps in the insulator Is. Hence, during the slow rise of the charging gate/main gap extinction voltage the discharging electron current flows gradually, that is, only by degrees, whereby the voltage between the floating gate G1 and the main gap does not attain the magnitude corresponding to curve F2. Thus, in accordance with the invention, the increase in the extinction voltage U$r$/U$t$ shall occur so slowly that there is no discharging hole current and the quenching period remains as constantly as possible.

An indication that there is a flow of a discharging hole current is obtained by measuring the voltage between the floating substrate IIT and the region S or D toward which the electron discharge shall occur. This voltage increases if there is also a current of holes. The highest value allowed for the invention for the velocity of increase in the extinction voltage is only a velocity at which one observes no further substantial increase in the quenching period, despite repeated quenchings and reprogrammings.

Figure 30:
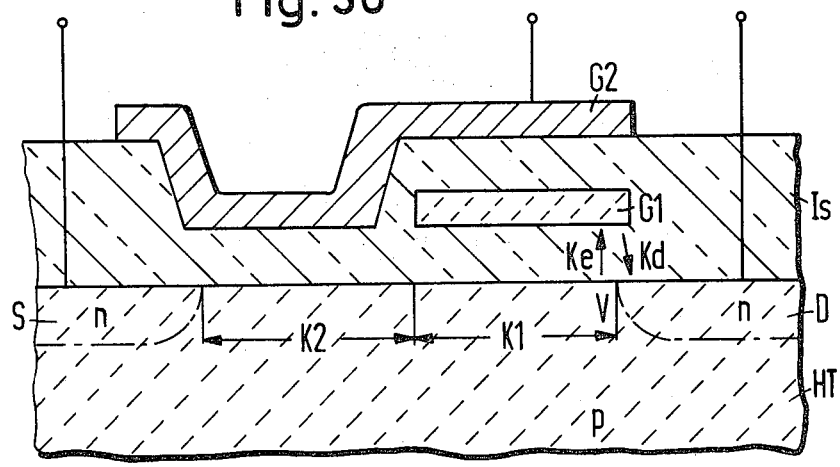

Because contamination is avoided, quenching can now also be performed at the same insulator site across which programming occurred. As shown in FIG. 30, one may first perform the programming at a channel site V near the drain by means of the hot electrons Ke and thereafter, the quenching toward the drain D by means of the discharging electron current K$d$ across virtually the same insulator site. In this case, too, one does not observe the otherwise normal and excessively strong increase in the quenching period and in the reprogramming period, or the excessively low charging of the floating gate after reprogramming, which is usual in cases of contamination.

In order to improve the quenching of the memory FET constructed according to the invention, a further development may be employed allowing excessive discharging of the floating gate G1 without switching the entire channel of the memory FET into the conducting state due to this excessive discharging. In this further development, provision is made, for example, that the floating gate of the memory FET covers only a first portion extending over the full width of the channel (see K1 in FIG. 30 of channel K1/K2). This first channel portion K1 shall include the channel site V emitting, during programming, the hot electrons by means of channel injection, or the first channel portion K1 shall at least be adjacent to the channel site V. Provision is also made that a charging gate G2, but not the floating gate G1, covers the remaining portion of the channel which is electrically in series (see K2 in FIG. 3), so that the state of the first portion K1 of the channel is controlled both by the state of the charging gate and by that of the floating gate. But, the state of the remaining portion K2 of the channel is controlled by the state of the charging gate only.

FIG. 29 shows a memory matrix substantially corresponding to the memory matrix of FIG. 4. However, the memory matrix depicted in FIG. 29 is equipped with the memory FET structures of FIG. 30. Memory matrices with such further developments can be operated differently during quenching.

First, the information stored in a single memory FET can be erased, even bit-by-bit. To do this, the extinction voltage, e.g., for quenching the memory FET T3, must be operative between the associated gate (X2) and the corresponding drain (Y1). For example, the rising extinction voltage can be generated by applying the potentials U$s$1 = 0v . . . +35V and U$t$1 = 0V to the selected storage cell, here switched to the conducting state under control of switch T5. In this case, the negative charge stored on the insulated floating gate of storage cell T3 is discharged toward switch T5 over drain D of the memory cell. To do this, one may apply, for example, +20V to the remaining control leads X connected to the charging gates and 0V to the remaining control leads Y connected to the drains, and the common terminal So may float so as to avoid unwanted interferences (i.e., quenchings and programmings) of the non-selected memory cells T1, T2, T4. Because of the floating of the common terminal So, main gate currents are avoided, which dissipate heat unnecessarily.

Second, the gross information stored in a row of the memory, or the gross information stored in several such rows, may be quenched simultaneously by electrical means. To do this, the proper potentials must be applied to all properly allocated matrix control leads X, Y. In this way, all the information stored in all rows can also be erased simultaneously by electrical means, by applying the proper potentials to all matrix control leads.

During the programming of a memory cell (e.g., T3), a programming potential U$t$2 of, e.g., +20V, may be applied to the control lead (X2) connected to the charging gate G2 and allocated to the memory cell. The programming potential U$t$2 accelerates the free electrons heated in the channel, by channel injection, in the direction of floating gate G1. To make sure that the proper channel site V emits the free electrons Ke, using channel injection, a programming voltage must be applied (cf. U$r$2/U$s$2), e.g., with the potentials U$r$ = 0V, U$s$2 = +20V to the main gap of the driven memory FET (T3). By allocating the potential 0V to the remaining matrix control lines X1, Y2, the remaining memory FETs T1, T2, T4 are not programmed, not read and not quenched. Thus, these remaining memory FETs consume no current.

The memory of FIG. 29 may also be read without requiring complex circuitry. During the reading of a selected memory cell, (e.g., T3), a read potential Ut3 (e.g., +5V) may be applied to the control lead (X2) connected to the charging gate and to this memory cell. The read potential switches the main gap of the memory cell (T3) to the conducting state if it is not programmed, and does not switch it (i.e., the first channel portion K1 of the memory cell structure of FIG. 30) to the conducting state, so that T3 remains blocked, if memory cell T3 is programmed. Whether the main gap of the relevant main cell is conducting or nonconducting is ascertained by the simultaneous application of a read voltage (U$r$3/U$s$3) over the switch T5 associated with the column concerned, e.g., with U$r$3 = +5 and U$s$3 = 0V. Thus, during the reading of a memory cell, a read potential of the control lead X2 allocated to the charging gate of the memory cell is applied and, in addition, a read voltage U$r$3/U$s$3 is applied to the main gap of the memory cell. The current flowing through the main gap K1/K2 produces a signal controlling the output amplifier LV. The output amplifier thus verifies if there is or there is no current, i.e., if memory cell T3 is programmed or not programmed.

During reading, as well as during programming, a 0 volt potential may, for example, be applied to the non-selected control lead X1 (FIG. 29) to make sure that no current can flow in any of the non-selected memory FETs.

The principles of this invention are described hereinabove by describing the structure, operating parameters and operating characteristics of alternative exemplary embodiments constructed according to those principles. It should be noted that the described structures, characteristics, and parameters can be modified or changed in a variety of ways, for example, changes in electrode shapes and relative arrangements, materials used, operating voltages used and the like, while remaining within the spirit and scope of the invention, as defined by the appended claims.

I claim:
1. An electronic storage device comprising:
   a p-doped semiconductor substrate having formed therein source and drain regions of n-doped materials, another region of said substrate between said source and drain regions forming a carrier channel therebetween,
   an insulation layer adjacent said substrate,
   a floating gate member arranged so as to have at least a portion of said insulation layer disposed between said channel and said floating gate and located so as to be able to receive electrons from said channel through said portion of said insulation layer,
   first means for applying a potential to said source and drain regions to produce a longitudinal field strength and a current of electrons between said source and drain regions,
   said longitudinal field strength in said carrier channel between said source and drain regions being sufficiently great to accelerate said electrons to a sufficiently great degree that at least a portion of them penetrate said portion of said insulation layer and charge said floating gate by channel injection, said floating gate being charged to a sufficiently great degree to inhibit, by electrostatic induction, said majority carrier flow between said source and drain regions.

2. The electronic storage device defined in claim 1 further comprising:
   a charging gate member,
   second means for applying a potential to said charging gate of a polarity opposite that of said electrons,
   the magnitude of said second potential being such, and said charging gate being so located, that said electrons are further accelerated toward said floating gate.

3. The electronic storage device defined in claim 2 wherein said charging gate is electrically connected to said drain region.

4. The electronic storage device defined in claim 2 further comprising third means for applying a positive potential to said charging gate for reading the charge state of said floating gate, said third potential being of such a magnitude that said source and drain regions will be conducting if said floating gate is uncharged and will not be conducting if said floating gate is charged.

5. The electronic storage device defined in claim 2, further comprising fourth potential means connected to said charging gate for applying a potential of a polarity and magnitude to said charging gate which will cause discharge of said floating gate.

6. The electronic storage device defined in claim 5 wherein said floating gate is discharged by holes generated by avalanche breakdown.

7. The electronic storage device defined in claim 2 wherein the distance between said charging gate and said floating gate is small relative to the portions of the lengths of said gates which are superimposed over said channel thereby producing capacitive coupling between said two gates.

8. The electronic storage device defined in claim 2 wherein said charging gate is arranged such that said floating gate is interposed between said charging gate and said carrier channel for controlling the charge and discharge of said floating gate, said floating gate and said charging gate being further arranged and shaped so that the capacitance between said floating gate and said charging gate is greater than the capacitance between said floating gate and said substrate.

9. The electronic storage device defined in claim 8 wherein said capacitance between said floating gate and said charging gate is substantially formed by an overlap of portions of the latter two gates placed laterally of said source and drain regions.

10. The electronic stage device defined in claim 2 further comprising:
    second potential means connected to said charging gate for applying thereto a potential for discharging said floating gate such that electrons stored on said floating gate are accelerated thereby in a direction away from said floating gate into said insulation and through said insulation layer to said channel to one of said source and drain regions.

11. The electronic storage device defined in claim 10 wherein said electrons are accelerated from said floating gate to the one of said source and drain regions which is fartherest away from the portion of said channel from which electrons are accelerated toward said floating gate during charging.

12. The electronic storage device defined in claim 10 wherein said second potential is a direct current voltage applied between said charging gate and one of said source or drain regions.

13. The electronic storage device defined in claim 10 wherein second potential is a train of pulses applied between said charging gate and one of said source or drain regions.

14. The electronic storage device defined in claim 10 wherein said second potential is formed by a constant potential applied to said charging gate and by pulses applied to said source region.

15. The electronic storage device defined in claim 14 wherein said floating gate is of a p-doped material such that discharge of said floating gate occurs, at least in part, through heating of electrons stored thereon.

16. The electronic storage device defined in claim 10 wherein said second potential has a time function as a result of which its amplitude produces a voltage sufficient to cause discharging of said floating gate by the Fowler-Nordheim tunnel effect.

17. The electronic storage device defined in claim 16 wherein said floating gate is a polycrystalline silicon material.

18. The electronic storage device defined in claim 16 further comprising:
third means for applying a potential between said charging gate and the said region toward which the discharge of said floating gate is to take place, said third potential being of a polarity as to cause said electrons to drift toward the latter region.

19. The electronic storage device defined in claim 18 wherein said third potential means supplied a sawtooth waveform voltage having a relatively low rise time.

20. The electronic storage device defined in claim 19 wherein said sawtooth waveform voltage is constituted by a train of amplitude modulated pulses, said pulses being amplitude modulated by said sawtooth waveform voltage.

21. The electronic storage device defined in claim 10 further comprising means for applying a bias potential to said substrate upon applying said second potential means to said charging gate.

22. The electronic storage device defined in claim 2 wherein said floating gate is constructed and arranged to be superimposed over only a first portion of said channel, which portion extends through the full width of said channel, and is superimposed over the portion of said channel where said electrons leave said channel to penetrate said insulating layer, said charging gate being constructed and arranged to be superimposed over at least a part of said floating gate and over the remaining portion of said channel, said remaining portion of said channel being connected in series electrically to said first portion of said channel so that the state of the first portion of said channel covered by said floating gate is controlled directly by the state of said charging gate, as well as by the state of said floating gate, but the state of said remaining portion of said channel is controlled directly by said charging gate only.

23. The electronic storage device defined in claim 22 further comprising:
third potential means for applying a potential to said charging gate for charging said floating gate, which potential is positive relative to the potential of said drain region when said channel is in a conducting state.

24. The electronic storage device defined in claim 22 wherein said floating gate includes a member extending laterally from said channel which forms a conducting connection insulated from said substrate by a thick oxide layer, a portion of said member being insulated from a portion of said source region or said drain region by a thin oxide layer.

25. The electronic storage device defined in claim 22 wherein said first portion of said channel covered by said floating gate is adjacent to said drain region.

26. The electronic storage device defined in claim 1 wherein the length of said channel is less than 10 micrometers.

27. The electronic storage device defined in claim 1 wherein said substrate has specific resistivity greater than 1 ohm-centimeter.

28. The electronic storage device defined in claim 1 wherein said carrier channel, when said floating gate is uncharged, conducts according to the enhancement mode.

29. The electronic storage device defined in claim 1 further comprising an additional layer of continuous p-doped material placed on the surface of said p-doped substrate between said drain and source regions and adjacent said insulating layer.

30. The electronic storage device defined in claim 1 wherein said insulating layer is of a thickness which exceeds the thickness value at which said floating gate, when charged, would be discharged, at least partially, by an avalanche breakdown condition should said drain region be connected to the drain region of another said electronic storage device in which the floating gate therein is being charged.

31. The electronic storage device defined in claim 30 wherein said thickness value is less than the value at which the quantities of electrons drifting from said floating gate is as large as the quantity of holes flowing under an avalanche breakdown condition from a non-conducting p-n junction of said channel to said floating gate.

32. Electronic storage apparatus comprising:
a plurality of memory cells, wherein each said memory cell comprises one electronic storage device, each said electronic storage device comprising:
a p-doped semiconductor substrate having formed therein source and drain regions of n-doped material, another region of said substrate between said source and drain regions forming a carrier channel therebetween,
an insulation layer adjacent said substrate,
a floating gate member arranged so as to have at least a portion of said insulation layer disposed between said channel and said floating gate and located so as to be able to receive electrons from said channel through said portion of said insulation layers,
first means for applying a potential to said source and drain regions to produce a longitudinal field strength and a current of electrons between said source and drain regions,
said longitudinal field strength in said carrier channel between said source and drain regions being sufficiently great to accelerate said electrons to a sufficiently great degree that at least a portion of them penetrate said portion of said insulation layer and charge said floating gate, said floating gate being charged to a sufficiently great degree to inhibit, by electrostatic induction, said majority carrier flow between said source and drain regions.

33. The electronic storage apparatus defined in claim 32 wherein said memory cells are arranged in a two dimensional matrix and further comprising:
first and second terminals in each electronic storage device connected, respectively, to said source and drain regions and third terminals in said electronic storage devices connected to said charging gates,
first control leads connected to said third terminals,
second control leads connected to said first terminals and
a common terminal connected to said second terminals.

34. The electronic storage apparatus defined in claim 33 further comprising:
first voltage means connected to at least one of said first control leads and to said common terminal for suppying a voltage thereto of a polarity and of sufficient magnitude to discharge said floating gates of connected memory cells, said floating gates thereby being discharged simultaneously.

35. The electronic storage apparatus defined in claim 33 further comprising:
second voltage means connected to said first control leads, said second control leads and said common terminal for applying a potential to said carrier channels of a polarity and magnitude for causing accumulation of negative charges on said floating gates.

36. An electron storage device comprising:
a semiconductor substrate having formed therein source and drain regions of materials producing opposite polarities to that of said substrate, another region of said substrate between said source and drain regions forming a carrier channel therebetween,
an insulation layer adjacent said substrate,
a floating gate member arranged so as to have at least a portion of said insulation layer disposed between said channel and said floating gate and located so as to be able to receive carriers from said channel through said portion of said insulation layer,
first means for applying a potential to said source and drain regions to produce a current of carriers having a polarity corresponding to the polarity of the majority carriers in said drain regions,
said channel having an inhomogeneity formed therein which, along with the magnitude of said potential, produces a longitudinal field strength between said source and drain regions which is sufficiently great to accelerate said majority carriers to a sufficiently great degree that they penetrate said portion of said insulation layer and charge said floating gate, said floating gate being charged to a sufficiently great degree to inhibit, by electrostatic induction, said majority carrier flow between said source and drain regions.

37. The electron storage device defined in claim 36 further comprising:
a charging gate member,
second means for applying a potential to said charging gate of a polarity opposite to that of said majority carriers,
the magnitude of said second potential being such, and said charging gate being so located, that said majority carriers are further accelerated toward said floating gate.

38. The electron storage device defined in claim 37 wherein said substrate is a p-doped material, wherein said source and drain regions are n-doped materials and wherein said second potential is positive relative to the potential existing in said channel.

39. The electron storage device defined in claim 38 further comprising third means for applying a positive potential to said charging gate for reading the charge state of said floating gate, said third potential being of such a magnitude that the source and drain regions will be conducting if said floating gate is uncharged and will not be conducting if said floating gate is charged.

40. The electron storage device defined in claim 37 wherein said charging gate is electrically connected to said drain.

41. The electron storage device defined in claim 37 further comprising fourth potential means connected to said charging gate for applying a potential of a polarity and magnitude to said charging gate which will cause discharge of said floating gate.

42. The electron storage device defined in claim 41 wherein said floating gate is discharged by holes generated by avalanche breakdown.

43. The electron storage device defined in claim 37 wherein the distance between said charging gate and said floating gate is small relative to the portions of the lengths of said gates which are superimposed over said channel thereby producing a capacitive coupling between said two gates.

44. The electron storage device defined in claim 36 wherein said substrate is a p-doped material and wherein said source and drain regions are n-doped materials.

45. The electron storage device defined in claim 44 further comprising an additional layer of continuous p-doped material placed on the surface of said p-doped substrate between said drain and source regions and adjacent said insulating layer.

46. The electron storage device defined in claim 36 wherein the length of said channel is less than 10 micrometers.

47. The electron storage device defined in claim 36 wherein said substrate has a specific resistivity greater than 1 ohm-centimeter.

48. The electron storage device defined in claim 36 wherein said inhomogeneity in said channel is a three dimensional spatial structural inhomogeneity.

49. The electron storage device defined in claim 36 wherein said channel, when said floating gate is uncharged, conducts according to the enhancement mode.

50. The electron storage device defined in claim 36 wherein said channel, when said floating gate is uncharged, conducts according to the depletion mode.

51. The electron storage device defined in claim 36 wherein said inhomogeneity is formed by a narrowing of said channel.

52. The electron storage device defined in claim 36 wherein said portion of said insulating layer contains a section which is thicker than the remainder of said portion and wherein said inhomogeneity is placed in said channel at a point corresponding to said thicker portion of said insulating layer.

53. The electron storage device defined in claim 36 wherein said inhomogeneity is placed at one end of said channel.

54. The electron storage device defined in claim 36 wherein said inhomogeneity is placed substantially at the center of said channel.

55. The electron storage device defined in claim 36 wherein said inhomogeneity is placed between one end of said channel and the center of said channel.

56. A field effect transistor storage device comprising:
a semiconductor substrate having source and drain regions of a material producing a polarity opposite that of the substrate formed therein, another region of said substrate between said source and drain regions forming a carrier channel therebetween, an insulation layer adjacent said substrate, a floating gate arranged so as to have at least a portion of said insulation layer disposed between said channel and said floating gate, first means for applying a potential to said source and drain regions to produce a current of carriers having a polarity corresponding to the polarity of the majority carriers in said drain region, said channel having an inhomogeneity formed therein which, along with the magnitude of said potential, produces a longitudinal field strength between said source and drain regions and accelerates said majority carriers to a sufficiently great degree that they penetrate said portion of said insulation layer and charge said floating gate, said floating gate being charged to a sufficiently great degree to inhibit, by electrostatic induction, said majority carrier flow between said source and drain regions and a charging gate arranged such that said floating gate is interposed between said charging gate and said channel for controlling the charge and discharge of said floating gate, said floating gate and said charging gate being further arranged and shaped so that the capacitance between said floating gate and said charging gate is greater than the capacitance between said floating gate and said substrate.

57. The field effect transistor storage device defined in claim 56 wherein said capacitance between said floating gate and said charging gate is substantially formed by an overlap portions of the latter two gates placed laterally of said source and drain regions.

58. The field effect transistor storage device defined in claim 56 further comprising:

second potential means connected to said charging gate for applying thereto a potential for discharging said floating gate such that electrons stored on said floating gate are accelerated thereby in a direction away from said floating gate into said insulation layer and through said insulation layer to said channel.

59. The field effect transistor storage device defined in claim 58 wherein said electrons accelerated from said floating gate to the one of said regions which is farthest away from the portion of said channel from which electrons are accelerated toward said floating gate during charging.

60. The field effect transistor storage device defined in claim 58 wherein said second potential is a direct current voltage applied between said charging gate and one of said source and drain regions.

61. The field effect transistor storage device defined in claim 58 wherein said second potential is a train of pulses applied between said charging gate and one of said source or drain regions.

62. The field effect transistor storage device defined in claim 58 wherein said second potential is formed by a constant potential applied to said charging gate and by another constant potential applied to said source region.

63. The field effect transistor storage device defined in claim 58 wherein said second potential is formed by a constant potential applied to said charging gate and by pulses applied to said source region.

64. The field effect transistor storage device defined in claim 63 wherein said floating gate is of a p-doped material such that discharge of such floating gate occurs at least in part, through heating of electrons stored thereon.

65. The field effect transistor storage device defined in claim 58 wherein said second potential has a time function, as a result of which its amplitude produces a voltage sufficient to cause discharging of said floating gate by the Fowler-Nordheim tunnel effect.

66. The field effect transistor storage device defined in claim 65 wherein said floating gate is a p-doped polycrystalline silicon.

67. The field effect transistor storage device defined in claim 58 further comprising means for applying a bias potential to said substrate upon applying said second potential means to said charging gate.

68. The field effect transistor storage device defined in claim 58 further comprising:

third potential means for applying a potential to said charging gate for charging said floating gate, which potential is positive relative to the potential of said drain region when said channel is in a conducting state.

69. The field effect transistor storage device defined in claim 56 wherein said insulating layer is of a thickness which exceeds the thickness value at which said floating gate, when charged, would be discharged, at least partially, by an avalanche breakdown condition should said drain region be connected to the drain region of another said field effect transistor storage device in which the floating gate is charged.

70. The field effect transistor storage device defined in claim 56 wherein said floating gate includes a member extending laterally from said channel which forms a conducting connection insulated from said substrate by a thick oxide layer, a portion of said member covering a portion of said source region or said drain region.

71. The field effect transistor storage device defined in claim 70 wherein said portion of said channel covered by said floating gate is adjacent to said drain region.

72. An electronic storage comprising:

a plurality of memory cells, each memory cell comprising:

a semiconductor substrate having source and drain regions of a material producing a polarity opposite to that of the substrate form therein, another region of said substrate between said source and drain regions forming a carrier channel therebetween, an insulation layer adjacent said substrate, a floating gate imbedded in said insulation layer, a controllable charging gate having a first terminal, first means for applying a potential to said source and drain regions to produce a current of carriers having a polarity corresponding to the polarity of the majority carriers in said drain region, said channel having an inhomogeneity formed therein which, along with the magnitude of said first potential, produces a longitudinal field strength between said source and drain regions and accelerates said majority carriers to a sufficiently great degree that they penetrate said insulation layer and charge said floating gate, said floating gate being charged to a sufficiently great degree to inhibit, by electrostatic induction, said majority carrier flow between said source and drain regions, second potential means for applying a potential between said charging gate and said main gap for discharging said floating gate by an effect that causes electrons stored on said floating gate to be accelerated in a direction away from said floating gate into said insulation layer and to drift through said insulation layer to said channel, said electronic storage further comprising:

first control leads connected to said first terminals, second control leads connected to a one of said regions in each said memory device, said second potential being applied to the one of said first control leads which is connected to the said memory device being discharged and to the said second control lead of that device.

73. The electronic storage defined in claim 72 further comprising:

third control leads connected to terminals of the others of said regions in said memory devices.

74. The electronic storage defined in claim 73 further comprising:

third potential means for charging said floating gates by being connected to the said first lead of said memory device being charged and fourth potential means for charging said floating gate by connection to ones of said second and third control leads connected to the said memory device being charged.

75. The n-channel field effect transistor storage device defined in claim 74 wherein said floating gate is superimposed over only a first portion of the width of said channel, said first portion containing the portion of said channel in which said inhomogeneity is located, said charging gate being superimposed over the remaining portion of said channel and being electrically in series so that state of the first portion of said channel is controlled both by the state of said floating gate and by the state of said charging gate, but the state of said remaining portion of said channel is only controlled by the state of said charging gate.

76. The electronic storage defined in claim 72 further comprising:

read potential means for reading said memory devices by connection to a said first control lead of the said memory device being read and read voltage means for reading said memory devices for connection to the ones of said second and third control leads connected to the said memory device being read.

77. A n-channel field effect transistor storage device comprising:

a semiconductor substrate having source and drain regions formed therein of a material producing a polarity opposite to that of the substrate, another region of said substrate between said source and drain regions forming a carrier channel therebetween, an insulation layer adjacent said substrate, a controllable charging gate having a first terminal, a floating gate interposed between said charging gate and said channel and imbedded in said insulation layer, first means for applying a potential to said source and drain regions to produce a current of carriers having a polarity corresponding to the polarity of the majority carriers in said drain region, said channel having an inhomogeneity formed therein which, along with the magnitude of said potential, produces a longitudinal field strength between said source and drain regions and accelerates said majority carriers to a sufficiently great degree that they penetrate said portion of said insulation layer and charge said floating gate, said floating gate being charged to a sufficiently great degree to inhibit, by electrostatic induction, said majority carrier flow between said source and drain regions, second means for applying a potential to said charging gate between said first terminal and said channel for applying a potential of a magnitude and polarity as to cause electrons stored on said floating gate to be accelerated away from said floating gate into a portion of said insulation layer between said floating gate and said channel and to drift through said insulation layer to said channel thereby causing discharge of said floating gate by the Fowler-Nordheim tunnel effect and third means for applying a potential between said first terminal and the said region in said channel toward which the discharge of said floating gate is to take place, said third potential being of a polarity as to cause said electrons to drift toward the latter region.

78. The n-channel field effect transistor storage device defined in claim 77 wherein said third potential means supplies a sawtooth waveform voltage having a relatively low rise time.

* * * * *

UNITED STATES PATENT AND TRADEMARK OFFICE
CERTIFICATE OF CORRECTION

PATENT NO. : 4,087,795
DATED : May 2, 1978
INVENTOR(S) : Bernward Rossler

It is certified that error appears in the above-identified patent and that said Letters Patent are hereby corrected as shown below:

Page 1, line 30, add the following foreign application priority data:

| --February 12, 1975 | Germany | 2505824 |
| March 25, 1975 | Germany | 2513207 |
| June 5, 1975 | Germany | 2525062 |
| June 5, 1975 | Germany | 2525097-- |

Signed and Sealed this

Seventh Day of August 1979

[SEAL]

Attest:

*Attesting Officer*

LUTRELLE F. PARKER
*Acting Commissioner of Patents and Trademarks*